(12) United States Patent
Brigg

(10) Patent No.: US 12,153,814 B2
(45) Date of Patent: *Nov. 26, 2024

(54) METHODS AND SYSTEMS FOR STORING VARIABLE LENGTH DATA BLOCKS IN MEMORY

(71) Applicant: Imagination Technologies Limited, Kings Langley (GB)

(72) Inventor: Robert Brigg, Watford (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/241,942

(22) Filed: Sep. 4, 2023

(65) Prior Publication Data
US 2023/0409221 A1 Dec. 21, 2023

Related U.S. Application Data

(63) Continuation of application No. 17/134,803, filed on Dec. 28, 2020, now Pat. No. 11,748,010.

(30) Foreign Application Priority Data

Dec. 27, 2019 (GB) ...................................... 1919378

(51) Int. Cl.
*G06F 3/06* (2006.01)
*H03M 7/40* (2006.01)

(52) U.S. Cl.
CPC ............ *G06F 3/064* (2013.01); *G06F 3/0604* (2013.01); *G06F 3/0659* (2013.01); *G06F 3/0673* (2013.01); *H03M 7/40* (2013.01)

(58) Field of Classification Search
CPC ...... G06F 3/064; G06F 3/0604; G06F 3/0659; G06F 3/0673; G06F 3/0608;
(Continued)

(56) References Cited

U.S. PATENT DOCUMENTS 5,761,536 A * 6/1998 Franaszek ............. G06F 12/023
713/1
6,851,027 B2 2/2005 Hansen
(Continued)

FOREIGN PATENT DOCUMENTS

| CN | 101086724 A | 12/2007 |
| CN | 105446964 A | 3/2016 |
| CN | 108268218 A | 7/2018 |

*Primary Examiner* — Khoa D Doan
*Assistant Examiner* — Tong B. Vo
(74) *Attorney, Agent, or Firm* — Potomac Law Group, PLLC; Vincent M DeLuca

(57) ABSTRACT

A set of two or more variable length data blocks is stored in memory. Each variable length data block has a maximum size of N*B, wherein N is an integer greater than or equal to two, and B is a maximum data size that can be written to the memory using a single memory access request. For each variable length data block of the set, the first P non-overlapping portions of size B of the variable length data block are stored in a chunk of the memory allocated to that variable length data block, wherein P is a minimum of (i) a number of non-overlapping portions of size B of the variable length data block and (ii) X which is an integer less than N. Any remaining portions of the variable length data blocks are stored in a remainder section of the memory shared between the variable length data blocks of the set. Information indicating the size of each of the variable length data blocks in the set is stored in a header.

20 Claims, 17 Drawing Sheets

(58) Field of Classification Search
CPC .......... G06F 12/023; H03M 7/40; G06T 1/60; G09G 5/395; G09G 5/393
See application file for complete search history.

(56) References Cited

U.S. PATENT DOCUMENTS

| | | |
|---|---|---|
| 7,652,596 B1 | 1/2010 | Sharma et al. |
| 8,243,086 B1 | 8/2012 | Diard |
| 2003/0026487 A1* | 2/2003 | Wada .................. H04N 19/42 386/E9.009 |
| 2014/0208003 A1 | 7/2014 | Cohen |
| 2016/0218739 A1 | 7/2016 | Lee |
| 2017/0371590 A1 | 12/2017 | Rankovic et al. |
| 2020/0285390 A1 | 9/2020 | Champoux |

* cited by examiner

METHODS AND SYSTEMS FOR STORING VARIABLE LENGTH DATA BLOCKS IN MEMORY

CROSS-REFERENCE TO RELATED APPLICATIONS AND CLAIM OF PRIORITY

This application is a continuation under 35 U.S.C. 120 of application Ser. No. 17/134,803 filed Dec. 28, 2020, now U.S. Pat. No. 11,748,010, which claims foreign priority under 35 U.S.C. 119 from United Kingdom Application No. 1919378.8 filed Dec. 27, 2019, the contents of which are incorporated herein by reference in their entirety.

BACKGROUND

There are many applications wherein variable length data blocks are stored in memory. For example, graphics processing systems are configured to receive graphics data (e.g. from an application running on a computer system) and to determine pixel values of a rendered image from the graphics data. In some cases, the pixel values for the image are divided into a plurality of blocks, each of which is individually compressed according to a lossless compression algorithm/scheme. This may result in variable length compressed blocks.

In these applications it is often desirable to be able to store the variable length data blocks in memory in a manner that reduces the amount of memory that is used to store the variable length data blocks; and/or allows the variable length data blocks to be stored and read from memory with a minimum number of memory access requests.

The embodiments described below are provided by way of example only and are not limiting of implementations which solve any or all of the disadvantages of known methods and systems for storing variable length data blocks in memory.

SUMMARY

This summary is provided to introduce a selection of concepts that are further described below in the detailed description. This summary is not intended to identify key features or essential features of the claimed subject matter, nor is it intended to be used to limit the scope of the claimed subject matter.

Described herein are methods and systems for storing a set of two or more variable length data blocks in memory. Each variable length data block has a maximum size of N*B, wherein N is an integer greater than or equal to two, and B is a maximum data size that can be written to the memory using a single memory access request. The method includes: storing, for each variable length data block in the set, the first P non-overlapping portions of size B of the variable length data block in a chunk of the memory allocated to that variable length data block, wherein P is the minimum of (i) the number of non-overlapping portions of size B of the variable length data block and (ii) X which is an integer less than N; storing any remaining portions of the variable length data blocks in the set in a remainder section of the memory that is shared between the variable length data blocks of the set; and storing, in a header section of the memory, information indicating a size of each variable length data block in the set.

A first aspect provides a method of storing a set of at least two variable length data blocks in memory, each variable length data block having a maximum size of N*B, wherein N is an integer greater than or equal to two, and B is a maximum data size that can be written to the memory using a single memory access request, the method comprising: storing, for each variable length data block in the set, a first P non-overlapping portions of size B of the variable length data block within a chunk of the memory allocated to that variable length data block, wherein P is a minimum of (i) a number of non-overlapping portions of size B of the variable length data block and (ii) X which is an integer less than N; storing any remaining portions of the variable length data blocks in the set in a remainder section of the memory that is shared between the variable length data blocks of the set; and storing, in a header section of the memory, information indicating a size of each of the variable length data blocks in the set. The chunk of the memory allocated to each variable length data block may have a size of X*B.

Storing the remaining portions of the variable length data blocks in the remainder section may comprise storing the remaining portions of the variable length data blocks adjacent each other in the remainder section.

The remaining portions of the variable length data blocks may be stored adjacent each other in the remainder section starting from a starting address of the remainder section.

The remaining portions of the variable length data blocks may be stored adjacent each other in the remainder section starting from a last address of the remainder section.

The remainder section may be divided into a plurality of B-sized parts and storing the remaining portions of the variable length data blocks in the remainder section may comprise: storing the remaining portion of a first variable length data block of the set at a start or at an end of the remainder section; making a determination, for each other variable length data block of the set, whether storing the remaining portion of that variable length data block adjacent to a previous remaining portion in the remainder section will cause that remaining portion of the variable length data block to be stored in at least two B-sized parts of the plurality of the B-sized parts; in response to determining that storing the remaining portion of a variable length data block adjacent the previous remaining portion in the remainder section will cause that remaining portion to be stored in at least two B-sized parts of the plurality of the B-sized parts, storing that remaining portion at a start of a next B-sized part of the remainder section; and in response to determining that storing the remaining portion of a variable length data block adjacent to the previous remaining portion in the remainder section will not cause that remaining portion to be stored in at least two B-sized parts of the plurality of the B-sized parts, storing that remaining porting adjacent the previous remaining portion in the remainder section.

Storing the remaining portions of the variable length data blocks in the remainder section may comprise forming one or more remainder blocks from the remaining portions and storing the one or more remainder blocks in the remainder section.

The remaining portions of the variable length data blocks may be stored in the remainder section in a same order that the first P non-overlapping portions of size B of the variable length data blocks are stored in the memory.

The remaining portions of the variable length data blocks may be stored in the remainder section in a different order than the first P non-overlapping portions of size B of the variable length data blocks are stored in the memory.

The chunk of the memory allocated to each variable length data block may have a size of (N−1)*B and X may be equal to N−1.

The remainder section may have a size of M*B wherein M is a number of variable length data blocks in the set.

Storing, in the header section of the memory, information indicating the size of each of the variable length data blocks in the set may comprise storing in a header for each of the variable length data blocks in the set, information identifying the size of that variable length data block.

The method may further comprise: receiving a modified version of a variable length data block in the set; storing a first P non-overlapping portions of size B of the modified version of the variable length data block in the chunk of the memory allocated to that variable length data block; reading the remaining portion of at least one other variable length data block of the plurality of variable length data blocks from the remainder section; forming a remainder block from any remaining portion of the modified version of the variable length data block and the remaining portion of the at least one other variable length data block; and storing the remainder block in the remainder section.

At least one of the variable length data blocks in the set may comprise a compressed block of data that was compressed in accordance with a lossless compression algorithm.

Each variable length data block may represent a portion of frame buffer data.

A second aspect provides a memory system for storing a set of at least two variable length data blocks in memory, each variable length data block having a maximum size of N*B, wherein N is an integer greater than or equal to two and B is a maximum data size that can be written to the memory using a single memory access request, the system comprising: memory comprising: a chunk allocated to each variable length data block of the set; a remainder section that is shared between the variable length data blocks of the set; and a header section; and logic configured to: store, for each variable length data block of the set, a first P non-overlapping portions of size B of the variable length data block within the chunk of the memory allocated to that variable length data block, wherein P is a minimum of (i) a number of non-overlapping portion of size B of the variable length data block and (ii) X which is an integer less than N; store, in the remainder section, any remaining portions of the variable length data blocks of the set; and store, in the header section, information indicating a size of each variable length data block of the set. Each chunk may have a size of X*B.

A third aspect provides a method of reading a variable length data block of a set of at least two variable length data blocks from memory, each variable length data block having a maximum size of N*B, wherein N is an integer greater than or equal to two and B is a maximum data size that can be written to the memory using a single memory access request, the method comprising: obtaining one or more headers for the set of variable length data blocks, the one or more headers comprising information identifying a size of each of the variable length data blocks in the set; determining from the one or more headers whether the variable length data block comprises at least one unit of size B; in response to determining that the variable length data block comprises at least one unit of size B, reading a first P units of size B from a chunk of the memory allocated to that variable length data block, wherein P is a minimum of (i) a number of units of size B of the variable length data block; and (ii) X which is an integer less than N; determining from the one or more headers whether the variable length data block comprises a remainder portion that is not stored in the chunk of memory allocated to that variable length data block; and in response to determining that the variable length data block comprises a remainder portion, identifying a location of the remainder portion in a remainder section of the memory shared between the plurality of variable length data blocks and reading the remainder portion for the variable length data block from the identified location in the remainder section. The chunk of the memory allocated to the variable length data block may have a size of X*B.

A fourth aspect provides a memory system for reading a variable length data block of a set of at least two variable length data blocks from memory, each variable length data block having a maximum size of N*B, wherein N is an integer greater than or equal to two and B is a maximum data size that can be written to the memory using a single memory access request, the system comprising: memory comprising: a chunk allocated to each variable length data block of the set; a remainder section that is shared between the variable length data blocks of the set; and a header section; and logic configured to: obtain, from the header section, one or more headers for the set of at least two variable length data blocks, the one or more headers comprising information identifying a size of each of the variable length data blocks in the set; determine from the one or more headers whether the variable length data block comprises at least one unit of size B; in response to determining that the variable length data block comprises at least one unit of size B, read the first P B-sized units of the variable length data block from the chunk of the memory allocated to that variable length data block, wherein P is a minimum of (i) a number of units of size B of the variable length data block and (ii) X which is an integer less than N; determine from the one or more headers whether the variable length data block comprises a remainder portion not stored in the chunk of memory allocated to that variable length data block; and in response to determining that the variable length data block comprises a remainder portion, identify a location of the remainder portion in the remainder section and read the remainder portion from the identified location in the remainder section. Each chunk may have a size of X*B.

A fifth aspect provides graphics processing system configured to perform the method of the first aspect or the method of the third aspect.

A sixth aspect provides a graphics processing system comprising the memory system of the second aspect or the memory system of the fourth aspect.

The memory systems (or the logic thereof) and graphics processing systems described herein may be embodied in hardware on an integrated circuit. There may be provided a method of manufacturing, at an integrated circuit manufacturing system, the memory systems (or the logic thereof) and/or the graphics processing systems described herein. There may be provided an integrated circuit definition dataset that, when processed in an integrated circuit manufacturing system, configures the system to manufacture a memory system (or the logic thereof) or a graphics processing system described herein. There may be provided a non-transitory computer readable storage medium having stored thereon a computer readable description of a memory system (or the logic thereof) or a graphics processing system that, when processed in an integrated circuit manufacturing system, causes the integrated circuit manufacturing system to manufacture an integrated circuit embodying the memory system (or the logic thereof) or the graphics processing system.

There may be provided an integrated circuit manufacturing system comprising: a non-transitory computer readable storage medium having stored thereon a computer readable description of the memory system (or the logic thereof) or the graphics processing system described herein; a layout processing system configured to process the computer readable description so as to generate a circuit layout description of an integrated circuit embodying the memory system (or the logic thereof) or the graphics processing system; and an integrated circuit generation system configured to manufacture the memory system (or the logic thereof) or the graphics processing system according to the circuit layout description.

There may be provided computer program code for performing a method as described herein. There may be provided non-transitory computer readable storage medium having stored thereon computer readable instructions that, when executed at a computer system, cause the computer system to perform the methods as described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
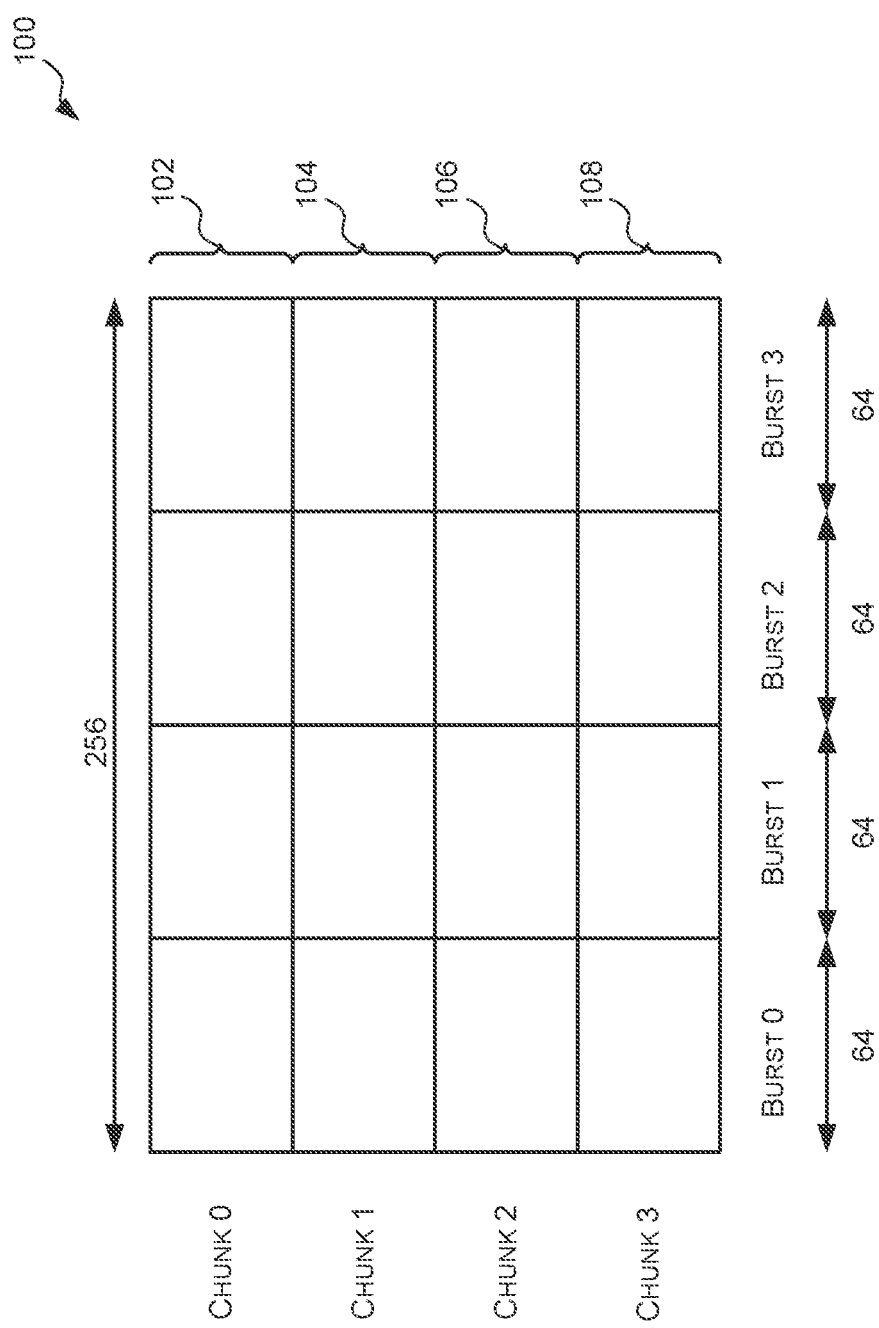
FIG. 1 is a schematic diagram illustrating a first example portion of memory for storing variable length data blocks.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments are described by way of example only.

As described above, there are many applications and systems which generate variable length data blocks that are to be stored in memory. Where the variable length data blocks have a maximum length or size, then a simple method of storing the variable length data blocks in memory may comprise allocating each variable length data block a chunk of memory that is large enough to store a variable length data block of the maximum size, and storing each variable length data block in its allocated chunk of memory.

Figure 2:
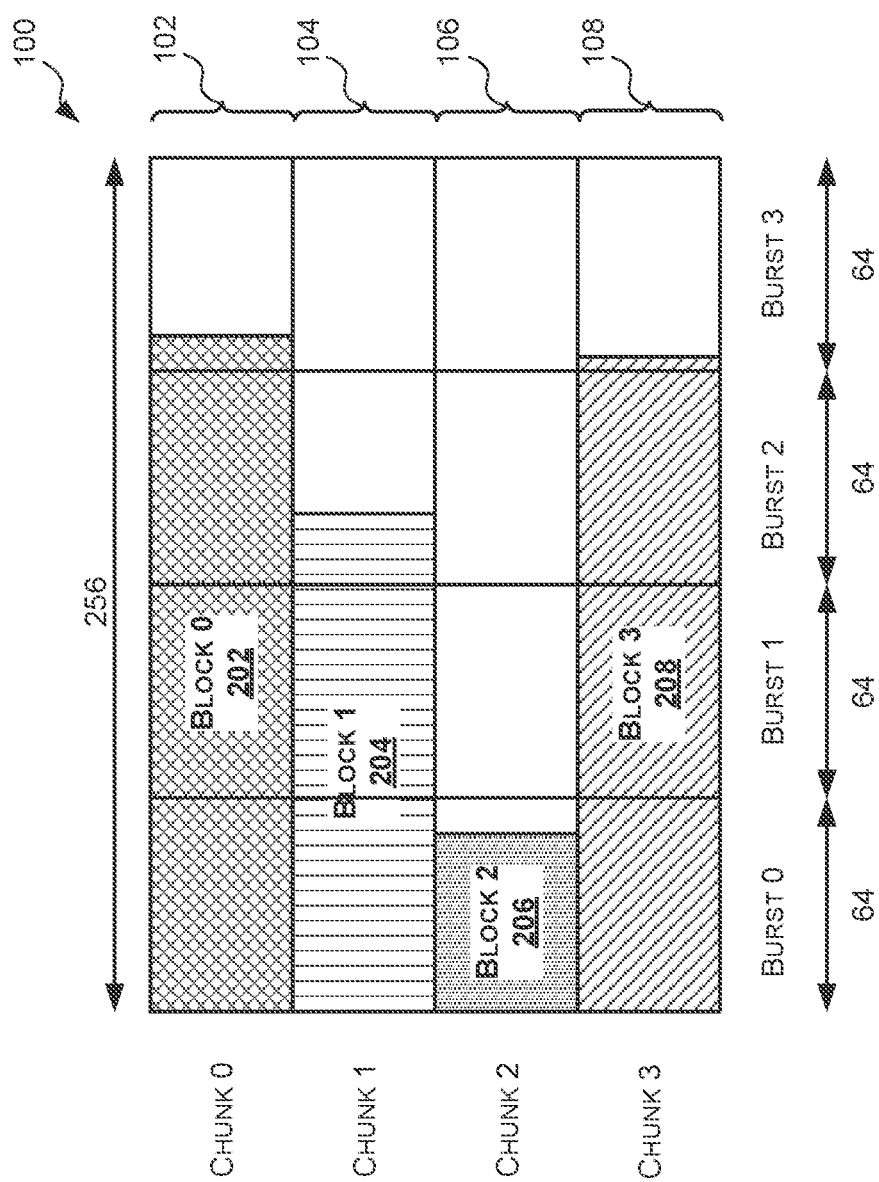
FIG. 2 is a schematic diagram illustrating a first example method of storing variable length data blocks in memory.

For example, if, as shown in FIG. 1, each variable length data block has a maximum length of 256 bytes then the memory may be divided into chunks of 256 bytes. For example, in FIG. 1 the memory 100 is divided into four chunks of 256 bytes 102, 104, 106, 108. Each variable length data block is then allocated a chunk of the memory and is stored in the associated chunk. For example, as shown in FIG. 2, a first variable length data block ('Block 0') 202 is allocated the first chunk ('Chunk 0') 102 and is stored therein (or written thereto); a second variable length data block ('Block 1') 204 is allocated the second chunk ('Chunk 1') 104 and is stored therein (or written thereto); a third variable length data block ('Block 2') 206 is allocated the third chunk ('Chunk 2') 106 and is stored therein (or written thereto); and a fourth variable length data block ('Block 3') 208 is allocated the fourth chunk ('Chunk 3') 108 and is stored therein (or written thereto). One of the advantages of this method is that it is easy to determine where each block is located in the memory as each block starts at the beginning of the associated chunk.

However, there is typically a limit on the amount of data that can be written to, or read from, memory via a single memory access request. The limit on the amount of data that can be written to, or read from, memory via a single memory access request is referred to herein as the maximum accessible data size. Where the system implements burst-mode memory reads/writes the maximum accessible data size may alternatively be referred to as the burst size. The burst size is often expressed as a number of words or double words. Where the maximum size of the variable length data blocks is greater than the maximum accessible data size then it may take more than one memory access request (e.g. more than one write request) to write a variable length data block to the corresponding chunk in memory. For example, if the maximum accessible data size is 64 bytes and a variable length data block may be up to 256 bytes, then it may take up to four memory access requests (four write requests) to store a variable length data block in memory.

In such cases, storing the variable length data blocks in separate chunks allocated to those variable length data blocks may result in extra memory access requests to store the variable length data blocks in memory. For example, in FIG. 2, the total size of the four example variable length data blocks ('Block 0', 'Block 1', 'Block 2', 'Block 3') 202, 204, 206 and 208 is less than ten times the maximum accessible data size, (i.e. less than 640 bytes) indicating that it may be possible to write the four variable length data blocks 202, 204, 206 and 208 to memory using ten write requests. However, it will take twelve memory access requests (e.g. twelve write requests) to write the four variable length data blocks 202, 204, 206 and 208 to memory because twelve different maximum accessible data size (e.g. 64 byte) portions of memory are written to. Where the variable length data blocks are compressed blocks (e.g. compressed blocks of a frame buffer) this may effectively reduce the compression rate of the compressed blocks.

Figure 3:
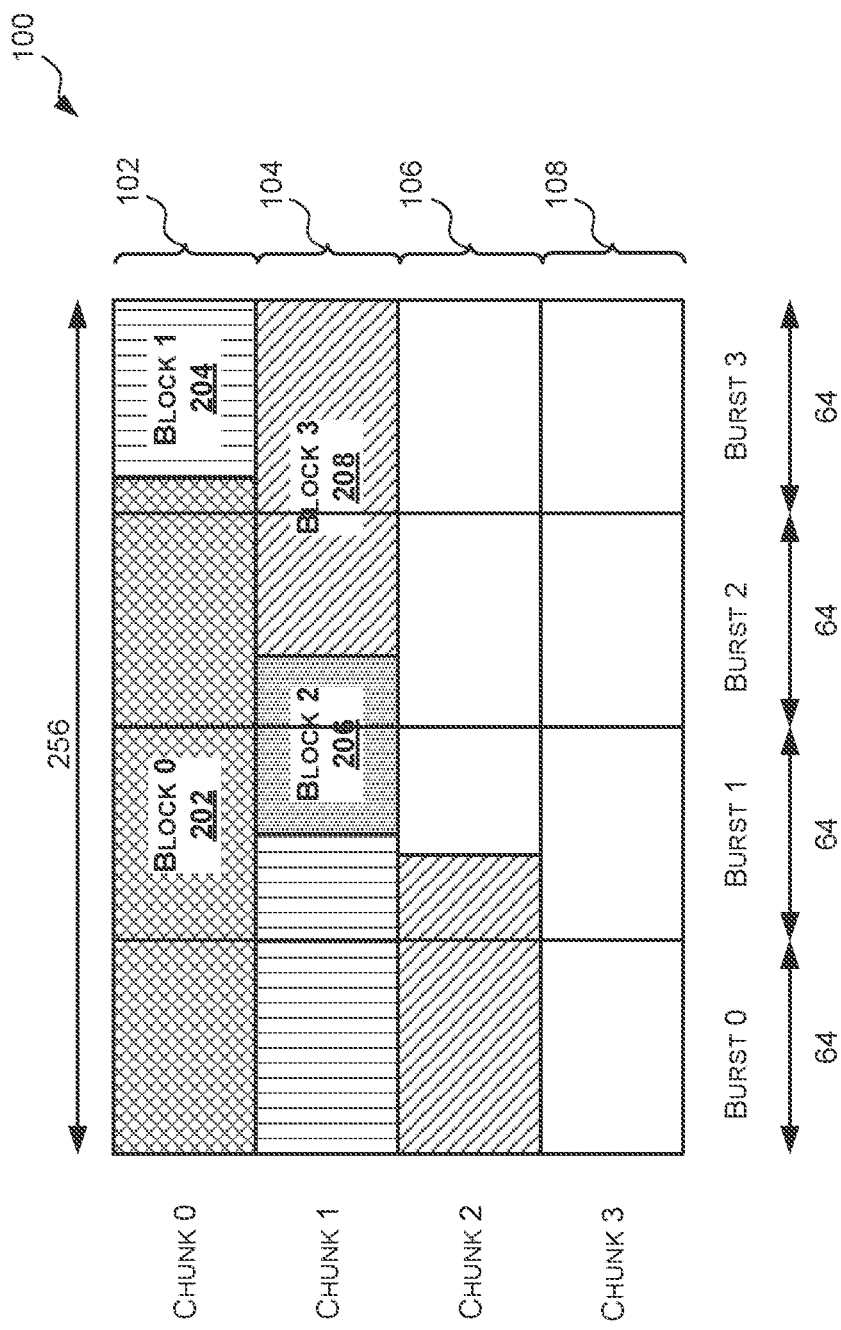
FIG. 3 is a schematic diagram illustrating a second example method of storing variable length data blocks in memory.

To address this issue, the variable length data blocks may be packed together in memory. For example, instead of each variable length data block being allocated its own dedicated chunk of memory, the variable length data blocks may be grouped into sets of M variable length data blocks, wherein M is an integer greater than or equal to two, and an amount of memory of size R may be allocated to the set wherein R is M times the chunk size. The M variable length data blocks in the set may be packed together and stored in the allocated memory as a packed block. Packing the variable length data blocks together in this manner may reduce the number of write requests to write the variable length data blocks to memory. For example, as shown in FIG. 3, if the set of four variable length data blocks 202, 204, 206, and 208 of FIG. 2 are allocated four chunks of memory and the variable length data blocks are packed together to form a packed block; and then the packed block is written to the allocated memory then the number of memory access requests to store the four variable length data blocks in memory may be reduced. Specifically, in FIG. 3 the packed block is only written to ten different maximum accessible data sized (e.g. 64 byte) portions of memory thus the packed block can be written to memory using only ten memory access requests (e.g. ten write requests) (as opposed to the twelve in the method shown in FIG. 2). Accordingly, storing variable length data blocks in this manner can reduce the number of memory access requests required to store a set of M variable length data blocks in memory which can improve the effective compression rate without changing the compression algorithm.

However, storing variable length data blocks in memory in the manner described with respect to FIG. 3 may make reading the variable length data blocks inefficient. Specifically, packing the variable length data blocks together may cause a variable length data block to be spread across K+1 maximum accessible data sized (e.g. 64 byte) portions of memory even though the variable length data block could fit within K maximum accessible data sized (e.g. 64 byte) portions of memory, wherein K is an integer greater than or equal to 1. This may mean that it may take K+1 memory access requests to read the variable length data block from memory instead of just K memory access requests. For example, in FIG. 3 the total size of the third variable length data block ('Block 2') 206 is less than the maximum accessible data size (e.g. less than 64 bytes) indicating that the third variable length data block ('Block 2') 206 could be stored in a single maximum accessible data size (e.g. 64 byte) portion of memory, however, the packing of the variable length data blocks together has resulted in the third variable length data block ('Block 2') 206 being spread across two maximum accessible data size (e.g. 64 byte) portions of memory meaning that it will take two memory access requests (e.g. two read requests) to read the third variable length data block ('Block 2') 206 from memory instead of just one.

Storing variable length data blocks in memory in the packed manner described with respect to FIG. 3 may also make modifying any of the variable length data blocks difficult. For example, if any of the variable length data blocks, other than the last variable length data block in the set (e.g. the fourth variable length data block ('Block 3') 208 in the example of FIG. 3) is modified in a way which changes its length or size then all of the following variable length data blocks in the set have to be read and re-packed in memory. For example, if the first variable length data block ('Block 0') 202 were modified in such a way that its length changes then all of the following blocks in the set ('Block 1', 'Block 2' and 'Block 3') 204, 206, 208 need to be read from memory, re-packed and re-written to memory.

Accordingly, described herein are methods and systems for storing variable length data blocks in memory that address one or more of the deficiencies with the previous methods of storing variable length data blocks in memory. Specifically, in the methods and systems described herein the variable length data blocks are grouped into sets of M variable length data blocks (wherein M is an integer greater than or equal to two) and each set of M variable length data blocks is allocated a portion of memory that is at least large enough to store M maximum sized variable length data blocks. The portion of the memory allocated to the set of M variable length data blocks is partitioned into a maximum accessible data unit section and a remainder section. Each variable length data block is allocated a chunk of the maximum accessible data unit section in which maximum accessible data units (i.e. maximum accessible data sized portions) of that variable length data block are stored, and any remaining portions of the variable length data blocks are stored in the shared remainder section. Information indicating or identifying the size of each of the variable length data blocks in the set is also stored in memory.

As will be described in more detail below, storing variable length data blocks in this manner can reduce the number of memory access requests to store the variable length data blocks without the problems associated with reading and/or amending the variable length data blocks that occur in the method described with respect to FIG. 3. Specifically, since it is only the remainder section that is shared by the variable length data blocks in the set, if a variable length data block is modified in a manner that changes its length or size, then only the remainder section has to be read and re-packed instead of having to read and re-pack all of the subsequent variable length data blocks.

Figure 4:
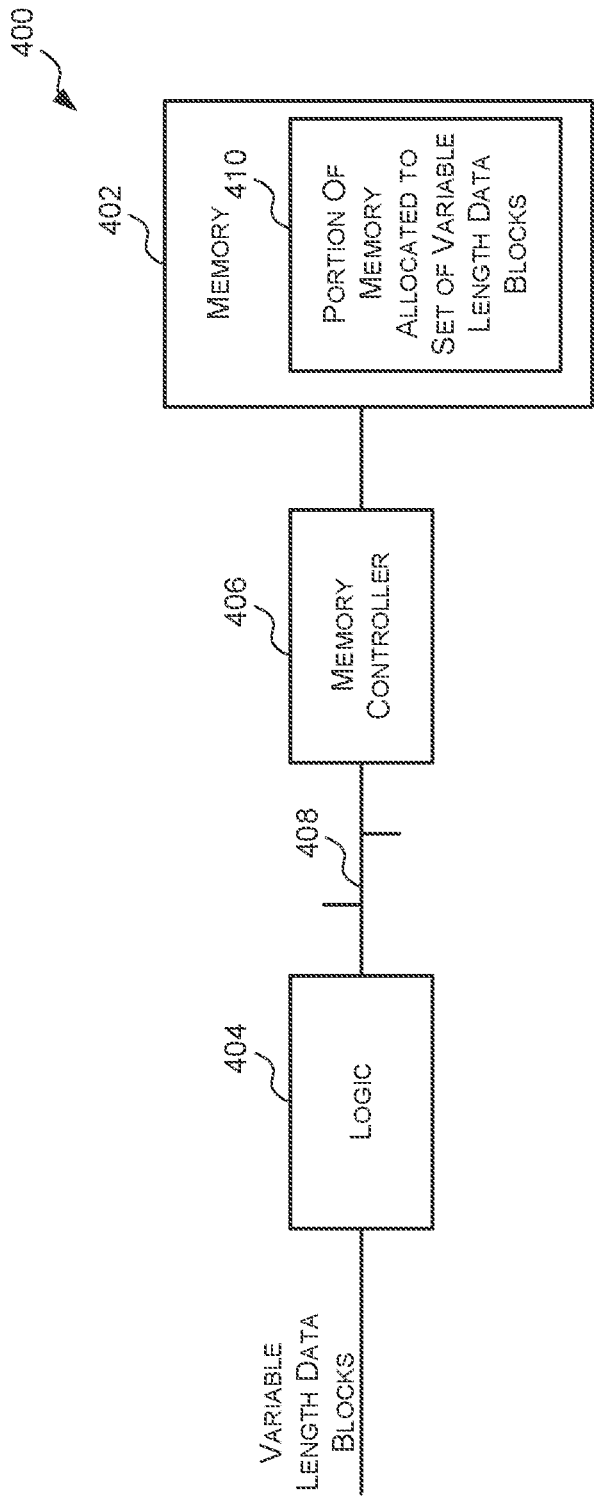
FIG. 4 is a block diagram of an example system for storing variable length data blocks in memory.

Reference is now made to FIG. 4 which illustrates an example memory system 400 for storing variable length data blocks in memory. The system comprises memory 402 for storing the variable length data blocks and logic 404 configured to receive variable length data blocks and determine how and where to store them in memory 402.

The memory 402 is a physical device configured to store digital information including, but not limited to, variable length data blocks. The memory 402 may be of any suitable form such as, but not limited to, DRAM (dynamic random access memory), SRAM (static random access memory) etc. The memory 402 is divided into addressable blocks of memory wherein each addressable block of memory can be accessed by a unique address.

In some cases, as shown in FIG. 4, the logic 404 may be connected to the memory 402 via a memory controller 406 and a memory bus 408. The memory controller 406 is configured to receive memory access requests from other components in the system, such as, but not limited to the logic 404, and write data to, or read data from, the memory 402 in accordance with the memory access requests. Each memory access request may be a read request or a write request. A read request specifies a location (e.g. an address) of the memory 402 which is to be read, and a write request specifies data to be written to the memory 402 and a location (e.g. an address) of the memory 402 where the data is to be written. In some cases, the memory 402 may support a burst mode of operation where multiple consecutive addressable blocks of memory can be read or written to via a single memory access request. For example, in some cases, each byte of memory may be addressable and when the memory 402 is operating in burst mode several bytes may be read from/written to via a single memory access request that only specifies the first address.

As described above, the maximum amount of data that can be written to memory via a single memory access request is referred to herein as the maximum accessible data size and a unit of data that is the maximum accessible data size is referred to herein as a maximum accessible data unit. For example, if the maximum accessible data size is 64 bytes then a 64-byte unit of data is a maximum accessible data unit.

The logic 404 is configured to receive variable length data blocks and store the variable length data blocks in the memory 402 in sets of M variable length data blocks, wherein M is an integer greater than or equal to two. In some cases, M may be 4. Each variable length data block has a maximum size of Y, wherein Y is an integer multiple of the maximum accessible data size. In other words, $Y=N*B$, wherein N is an integer greater than or equal to two, and B is the maximum accessible data size. The variable length data blocks may represent any type of data. In some cases, each variable length data block may represent a block of frame buffer data or image data. However, it will be evident to a person of skill in the art that this is an example only.

More specifically, the logic 404 is configured to store each set of M variable length data blocks in memory in a portion 410 of memory allocated to that set of M variable length data blocks. It may be the logic 404 itself that allocates each set of M variable length data blocks a portion 410 of the memory 402, or it may be another component or device that allocates each set of M variable length data blocks a portion 410 of the memory 402.

Figure 5:
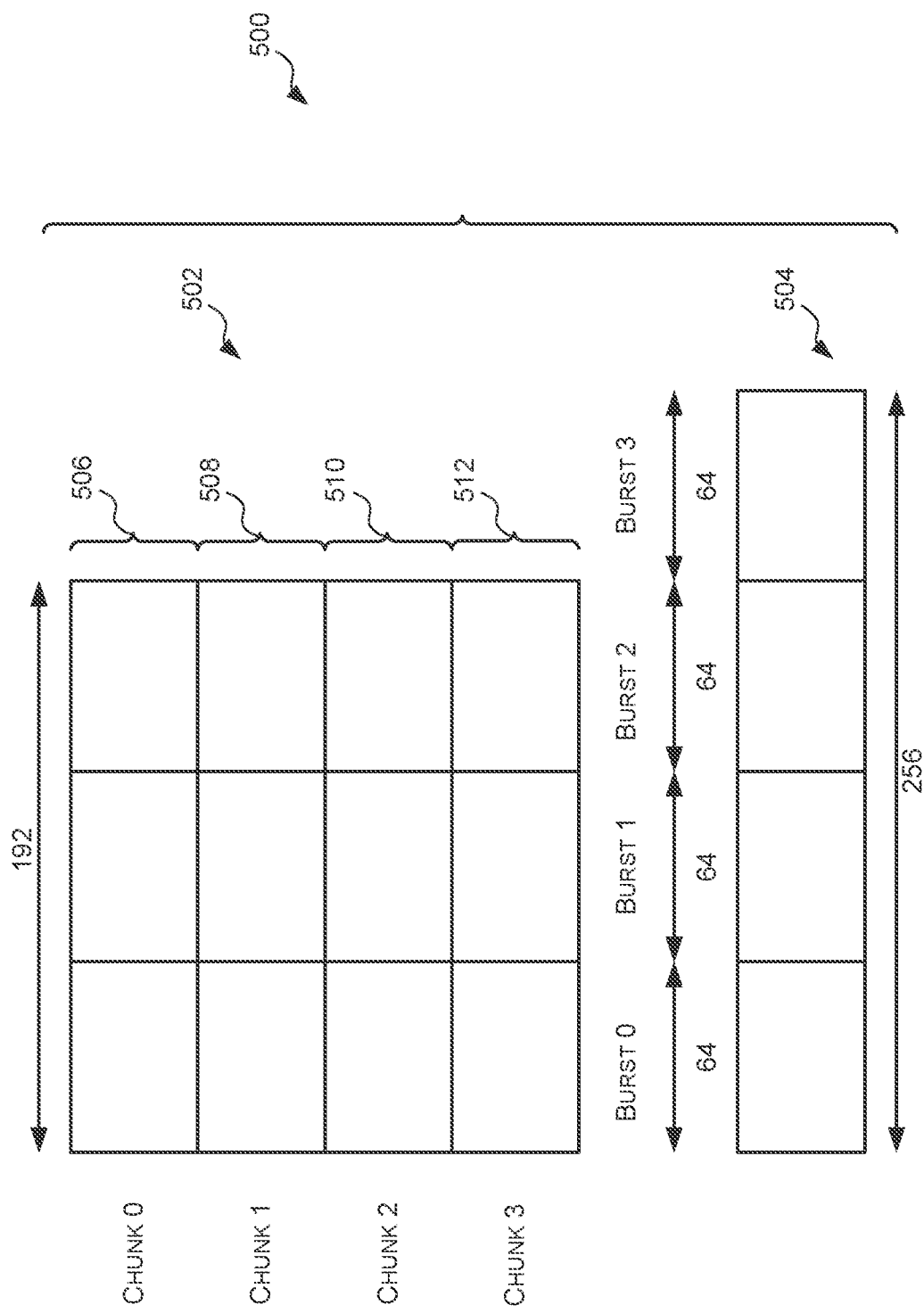
FIG. 5 is a schematic diagram of a second example portion of memory for storing variable length data blocks comprising a maximum accessible data unit section and a remainder section.

The portion 410 of memory 402 allocated to a set of M variable length data blocks is at least large enough to store M maximum sized variable length data blocks. For example, where the maximum size of a variable length data block is Y then the portion 410 of memory 402 allocated to a set of M variable length data blocks is greater than or equal to Y*M in size. FIG. 5 illustrates an example portion 500 of memory which is allocated to a set of four variable length data blocks (i.e. M=4), where the maximum size of a variable length data block is 256 bytes (i.e. Y=256). In this example, the portion 500 of memory allocated to a set of four variable length data blocks is 256*4=1024 bytes.

The portion 410 of memory 402 allocated to a set of M variable length data blocks is partitioned or subdivided into a maximum accessible data unit section and a remainder section. Each section is sized to store a predetermined number of maximum accessible data units of each variable length data block. Specifically, the maximum accessible data unit section is sized to store X maximum accessible data units of each variable length data block, and the remainder section is sized to store Z maximum accessible data units of each variable wherein X+Z=N. In some cases, the maximum accessible data unit section is configured to store more maximum accessible data units per variable length data block than the remainder section (e.g. in some cases X>Z). Preferably, the remainder section is sized to store one maximum accessible data unit from each variable length data block in the set and the maximum accessible data unit section is sized to store N−1 maximum accessible data units from each variable length data block in the set.

For example, where the maximum accessible data size is B, and there are M variable length data blocks in each set, then the remainder section may have a size of B*M and the maximum accessible data unit section may have a size of B*(N−1)*M. In the example shown in FIG. 5 wherein B=64 bytes, M=4 and N=4 the 1024 byte portion 500 of memory allocated to the set of M variable length data blocks is partitioned into a maximum accessible data unit section 502 of size B*(N−1)*M=64*(4−1)*4=768 bytes and a remainder section 504 of size B*M=64*4=256 bytes.

The maximum accessible data unit section is sub-divided into M equal-sized chunks and each variable length data block in the set is allocated one of the chunks. Each chunk is sized to store X maximum accessible data units. For example, in the example shown in FIG. 5 where B=64 bytes, N=4 and M=4 the maximum accessible data unit section is divided into four equal-sized chunks (a first chunk ('Chunk 0') 506, a second chunk ('Chunk 1') 508, a third chunk ('Chunk 2') 510, and a fourth chunk ('Chunk 3') 512). The first chunk ('Chunk 0') 506 may be allocated to the first variable sized data block in the set, the second chunk ('Chunk 1') 508 may be allocated to the second variable length data block in the set, the third chunk ('Chunk 2') 510 may be allocated to the third variable length data block in the set, and the fourth chunk ('Chunk 3') 512 may be allocated to the fourth variable length data block in the set. Although in this example the chunks 506, 508, 510, 512 of the maximum accessible data unit section 502 have been allocated to the variable length data blocks in the set in order, the chunks 506, 508, 510, 512 may be allocated to the variable length data blocks in any manner. For example, the first chunk may be allocated to the fourth variable length data block, the second chunk may be allocated to the first variable length data block etc.

The logic 404 is then configured to store, for each variable length data block in the set, the first P maximum accessible data units of the variable length data block in the chunk of the maximum accessible data unit section allocated to that variable length data block, wherein P is the minimum of (i) the number of maximum accessible data units in the variable length data block and (ii) X; and store any remaining portions of the variable length data blocks in the set in the shared remainder section. An example method which may be implemented by the logic 404 to store a set of M variable length data blocks in the maximum accessible data unit section and the remainder section of the portion of memory allocated to the set of M variable length data blocks is described with respect to FIG. 6.

Figure 6:
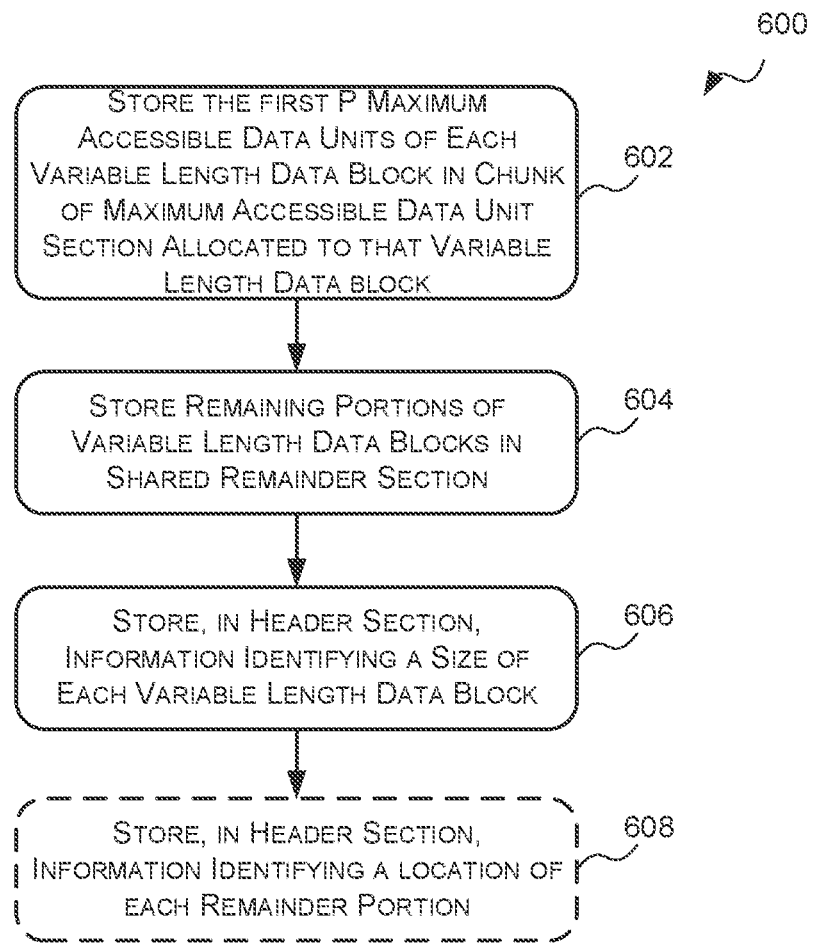
FIG. 6 is a flow diagram of a third example method of storing variable length data blocks in memory.

Reference is now made to FIG. 6 which illustrates an example method 600 of storing a set of variable length data blocks in a portion of memory, wherein the portion of memory is partitioned into a maximum accessible data unit section and a remainder section as described above. The method may be implemented by the logic 404 of FIG. 4.

The method 600 begins at step 602 where the logic 404 stores, for each variable length data block in the set, the first P maximum accessible data units of the variable length data block in the chunk of the maximum accessible data unit section allocated to that variable length data block. P is the minimum of (i) the number of maximum accessible data units that the variable length data block comprises, G, and (ii) X (i.e. P=min (G, X)). As described above, X is an integer representing the number of maximum accessible data units that can be stored in the chunk of the maximum accessible data unit section allocated to a particular variable length data block. As described above, X is less than N. Preferably X is N−1.

This may comprise, determining, for each variable length data block in the set, the number of maximum accessible data units G that the variable length data block comprises. The number of maximum accessible data units G that a variable length data block comprises can be described as the number of non-overlapping units or portions of the maximum accessible data size (i.e. of size B or B-sized) that the variable length data block comprises. The number of maximum accessible data units that a variable length data block comprises may be determined by calculating the floor of the quotient of the size S of the variable length data block and the maximum accessible data size B $$\left(\text{i.e. } G = \left\lfloor \frac{S}{B} \right\rfloor\right).$$

In other words, the number of maximum accessible data units that a variable length data block comprises may be calculated as the integer portion of the result of the division of the size S of the variable length data block and the maximum accessible data size B. For example, if the maximum accessible data size is 64 bytes, then a variable length data block of 150 bytes comprises $$\left\lfloor \frac{150}{64} \right\rfloor = 2$$

maximum accessible data units.

If the number of maximum accessible data units G that a variable length data block comprises is less than or equal to X (i.e. G≤X), then the identified maximum accessible data units for that variable length data block G are stored in the corresponding chunk of the maximum accessible data unit section. If, however, the number of maximum accessible data units G that a variable length data block comprises is greater than X (i.e. G>X), then the first X maximum accessible data units are written to the corresponding chunk of the maximum accessible data unit section. If it is determined that a variable length data block does not comprise any maximum accessible data units (i.e. the size of the variable length data block is less than the maximum accessible data size such that G=0) then no portion of the variable length data block is stored in the corresponding chunk of the maximum accessible data unit section of memory.

Figure 7:
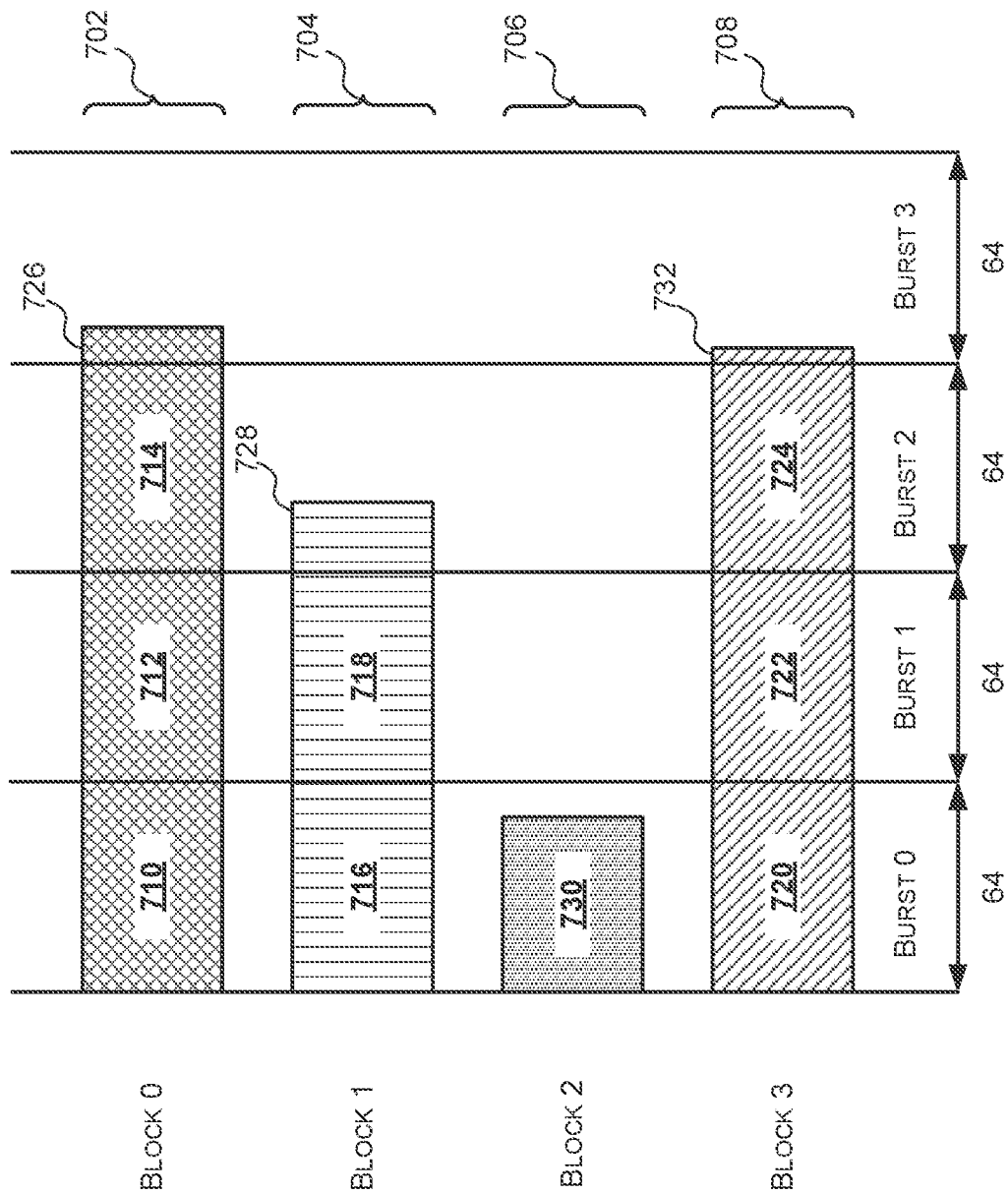
FIG. 7 is a schematic diagram illustrating an example set of variable length data blocks.
Figure 8:
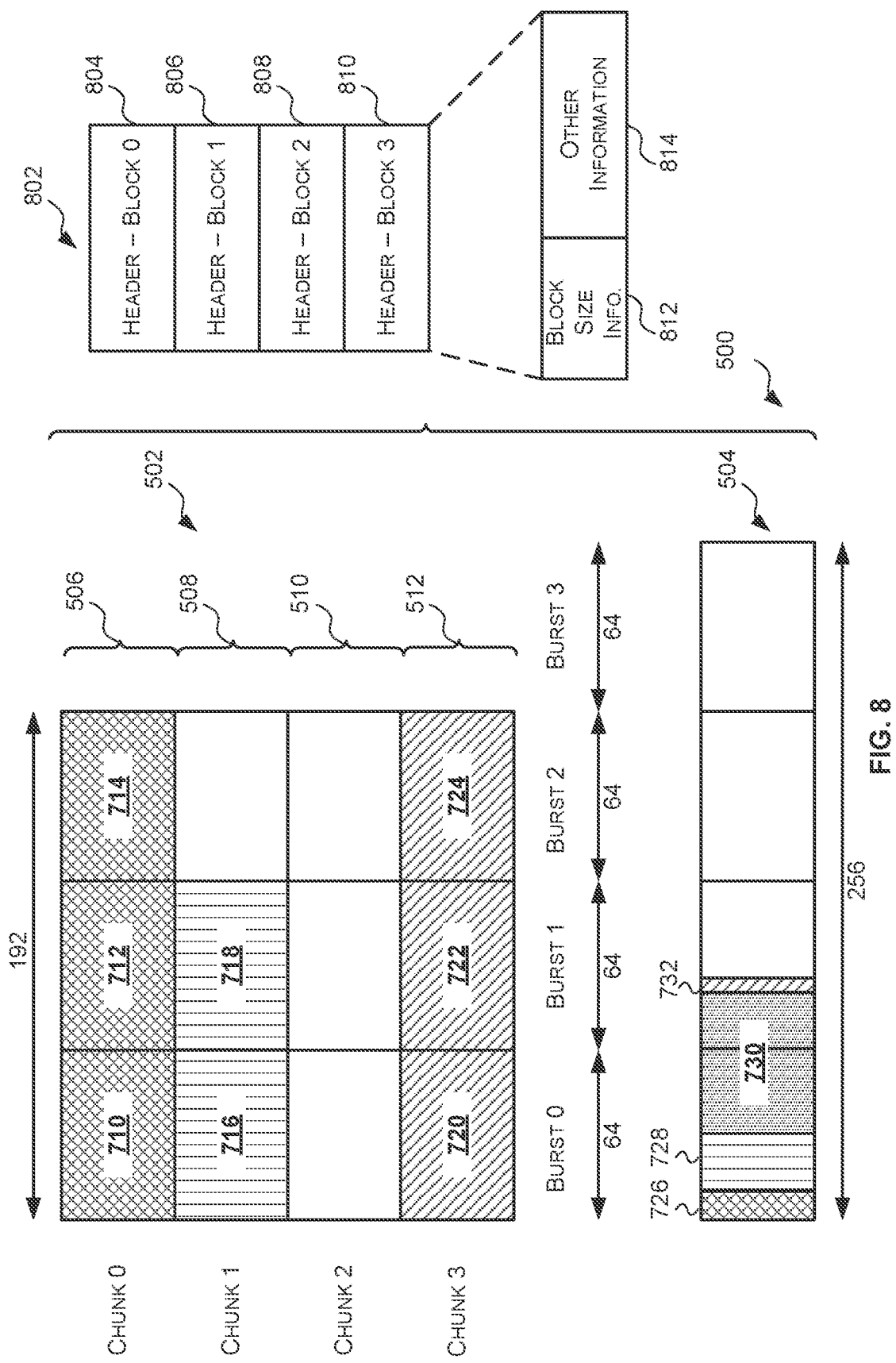
FIG. 8 is a schematic diagram illustrating a first example method of storing the set of variable length data blocks of FIG. 7 in the portion of memory of FIG. 5.

For example, FIG. 7 illustrates an example set of variable length data blocks that comprises a first variable length data block ('Block 0') 702, a second variable length data block ('Block 1') 704, a third variable length data block ('Block 2') 706, and a fourth variable length data block ('Block 3') 708 which is to be stored in the portion 500 of memory shown in FIG. 5 wherein X=N−1=3. As shown in FIG. 8, the first variable length data block ('Block 0') 702 has been allocated the first chunk ('Chunk 0') 506 of the maximum accessible data unit section 502, the second variable length data block ('Block 1') 704 has been allocated the second chunk ('Chunk 1') 508 of the maximum accessible data unit section 502, the third variable length data block ('Block 2') 706 has been allocated the third chunk ('Chunk 2') 510 of the maximum accessible data unit section 502, and the fourth variable length data block ('Block 3') 708 has been allocated the fourth chunk ('Chunk 3') 512 of the maximum accessible data unit section 502.

As shown in FIG. 7, the first variable length data block ('Block 0') 702 comprises three maximum accessible data units 710, 712 and 714 so, as shown in FIG. 8, these three maximum accessible data units 710, 712 and 714 are written to the first chunk ('Chunk 0') 506 of the maximum accessible data unit section 502. The second variable length data block ('Block 1') 704 comprises two maximum accessible data units 716 and 718 so, as shown in FIG. 8, these two maximum accessible data units 716 and 718 are written to the second chunk ('Chunk 1') 508 of the maximum accessible data unit section 502. The third variable length data block ('Block 2') 706 does not comprise any maximum accessible data units (i.e. it is less than the maximum accessible data size (e.g. 64 bytes)), so, as shown in FIG. 8, none of the third variable length data block ('Block 2') 706 is written to the third chunk ('Chunk 2') 510 of the maximum accessible data unit section 502. The fourth variable length data block ('Block 3') 708 comprises three maximum accessible data units 720, 722 and 724, so, as shown in FIG. 8, these three maximum accessible data units 720, 722, and 724 are written to the fourth chunk ('Chunk 3') 512 of the maximum accessible data unit section 502. In the example shown in FIG. 8 the maximum accessible data units of each variable length data block are written to the corresponding chunk of the maximum accessible data unit section in order beginning at the starting, or first, address of that chunk. However, in other examples the maximum accessible data units of the variable length data blocks may be written to the corresponding chunk of the maximum accessible data unit section in any suitable manner (e.g. starting with the last address).

Once the first P maximum accessible data units of each variable length data block in the set are written to the corresponding chunks of the maximum accessible data unit section 502, the method 600 proceeds to step 604.

At step 604, the remaining portions of the variable length data blocks are written to the remainder section 504. The remaining portion (which may also be referred to as the remainder portion) of a variable length data block may be described as the portion of the variable length data unit that was not stored in the maximum accessible data unit section 502 of the memory, or the portion of a variable length data block that does not form part of the first P maximum accessible data units.

For example, as shown in FIGS. 7 and 8 the remainder portion 726 of the first variable length data block ('Block 0') 702, the remainder portion 728 of the second variable length data block ('Block 1') 704, the remainder portion 730 of the third variable length data block ('Block 2') 706 (which is the entire variable length data block in this example), and the remainder portion 732 of the fourth variable length data block ('Block 3') 708 are stored in the remainder section 504 of the portion 500 of the memory allocated to the set. Although in this example, each variable length data block comprises a remainder portion, in other examples one or more of the variable length data blocks may not comprise a remainder portion. This may occur when a variable length data block is less than or equal to X*B and its size is an integer multiple of the maximum accessible data size B. For example, if the maximum accessible data size is 64 bytes and X=3 then there may be no remainder portion if the variable length data block is 64 bytes, 128 bytes or 192 bytes.

In some cases, the remainder portions of the variable length data blocks may be packed together in the remainder section 504 one after another (e.g. adjacent to each other) such that there are no substantial gaps between the remainder portions in the remainder section. For example, as shown in FIG. 8, the remainder portions 726, 728, 730 and 732 are stored in the remainder section 504 one after another. Specifically, the first remainder portion 726 (i.e. the remainder portion of the first variable length data block ('Block 0') 702) is stored at the beginning or start (e.g. at the beginning or starting address) of the remainder section 504; the second remainder portion 728 (i.e. the remainder portion of the second variable length data block ('Block 1') 704) is stored adjacent to the first remainder portion 726; the third remainder portion 730 (i.e. the remainder portion of the third variable length data block ('Block 2') 706) is stored adjacent to the second remainder portion 728; and the fourth remainder portion 732 (i.e. the remainder portion of the fourth variable length data block ('Block 3') 708) is stored adjacent to the third remainder portion 730. In another example, the remainder portions 726, 728, 730 and 732 may be stored adjacent each other in the remainder section 504 starting from the end (i.e. at the end or last address) of the remainder section 504. Depending on the configuration of the memory, storing a remainder portion adjacent to another remainder portion may result in small gap between the two remainder portions in memory. For example, remainder portions may be stored at a word boundary or a double word boundary so if the preceding remainder portion did not end at a word or double word boundary the next remainder portion may be stored at the next word or double word boundary creating a small gap in the memory between them. However, such a gap will be understood herein as being a non-substantial gap.

While storing the remainder portions back to back (or adjacent each other) in the remainder section 504 allows the remainder portions to be stored in the remainder section 504 using the least number of memory access requests, this may result in one or more of the remainder portions spanning multiple B-sized (e.g. maximum accessible data sized) portions of the remainder section 504. This means that although the remainder portion may be less than the maximum accessible data size, multiple memory access requests (e.g. read requests) may be required to read that remainder portion from memory. For example, as shown in FIG. 8, the third remainder portion 730 (i.e. the remainder portion for the third variable length data block ('Block 2') 706) is less than the maximum accessible data size (see FIG. 7). But the third remainder portion 730 is stored in two B-sized (e.g. maximum accessible data sized portions) indicating it will take two read requests to read the third remainder portion 730 from memory. Accordingly, in other examples, a remainder portion may only be stored adjacent to the preceding remainder portion in the remainder section 504 if storing that remainder portion adjacent the preceding remainder portion does not cause that remainder portion to be stored in multiple B-sized portions or parts of the remainder section. An example method of storing the remainder portions in the remainder section 504 in this manner is described below with respect to FIGS. 9 and 10.

Figure 10:
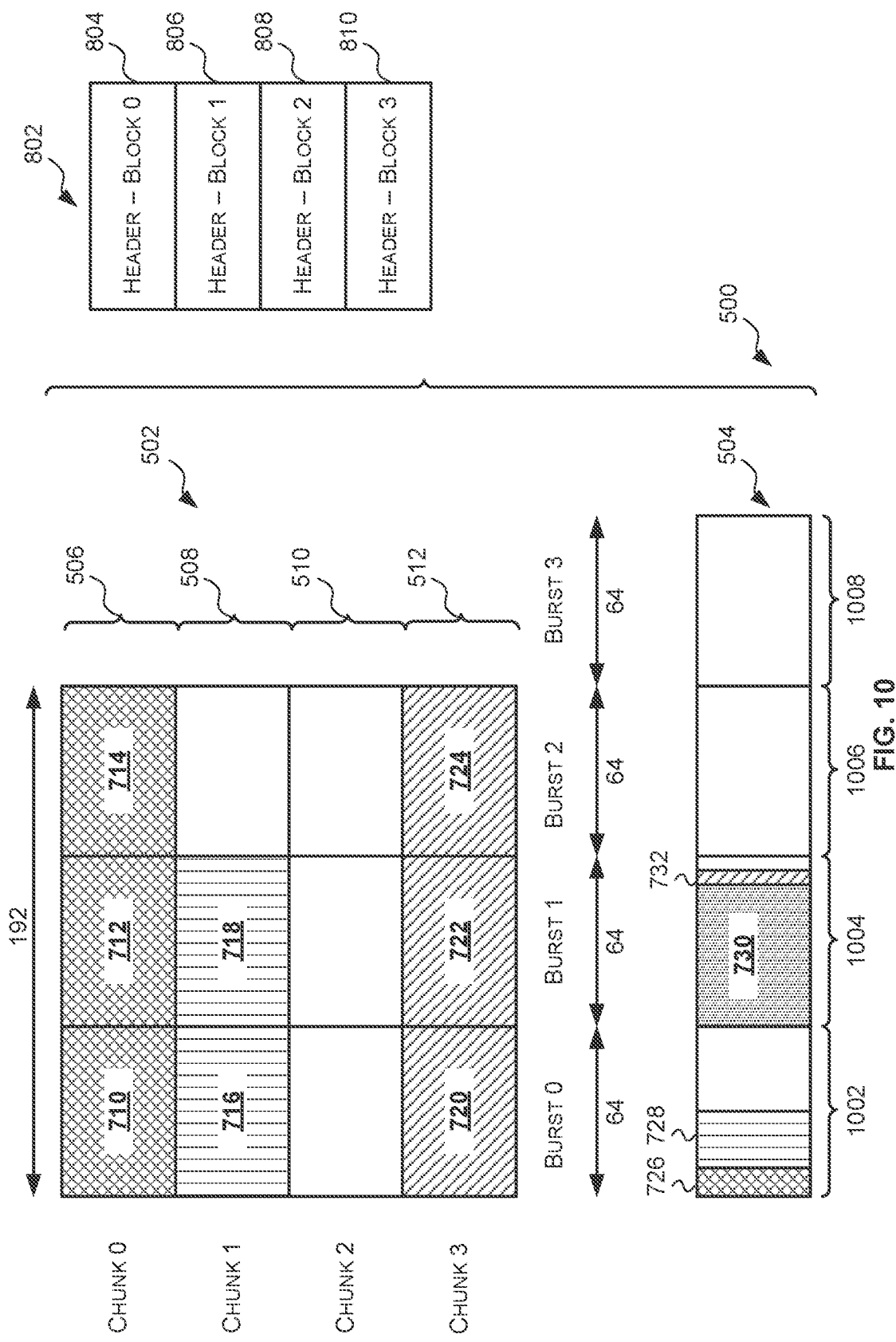
FIG. 10 is a schematic diagram illustrating storing the remainder portions in the remainder section in accordance with the method of FIG. 9.

In some cases, as shown in FIGS. 8 and 10, the remainder portions of the variable length data blocks may be stored in the remainder section 504 in the same order as their corresponding maximum accessible data units are stored in the maximum accessible data unit section 502. For example, if the maximum accessible data units of the first variable length data block are stored before the maximum accessible data units of the second variable length data block in the maximum accessible data unit section 502, then the remainder portion of the first variable length data block may be stored in the remainder section 504 before the remainder portion of the second variable length data block. In yet other cases, the remainder portions of the variable length data blocks may be stored in the remainder section 504 in a different order than their corresponding maximum accessible data units are stored in the maximum accessible data unit section 502. For example, if the maximum accessible data units of the first variable length data block are stored before the maximum accessible data units of the second variable length data block in the maximum accessible data unit section 502, then the remainder portion of the second variable length data block may be stored in the remainder section 504 before the remainder portion of the first variable length data block.

In some cases, storing the remainder portions in the remainder section 504 may comprise forming one or more remainder blocks from the remainder portions and then storing the remainder block(s) in the remainder section 504. The remainder block(s) may be formed from the remainder portions in accordance with any of the methods described above. For example, a single remainder block may be formed by packing the remainder portions back to back as described above. That remainder block may then be stored at, for example, the start of the remainder section or the end of the remainder section.

Forming one or more remainder blocks and then storing the remainder block(s) in the remainder section, as opposed to storing the remainder portions in the remainder section on a remainder portion basis, may reduce the number of memory access requests used to store the remainder portions in the remainder section. For example, if there are four remainder portions and each portion is stored in the remainder section via a separate memory access request (e.g. write request) then it would take four memory access requests to store the remainder portions in memory. In contrast, if the four remainder portions are packed together to form a remainder block that can be stored across two B-sized (i.e. maximum accessible data sized) portions, then the remainder portions can be written to the remainder section using only two memory access requests.

Once the remainder portions of the variable length data blocks are stored in the shared remainder section 504 the method 600 proceeds to step 606.

At step 606, information indicating or identifying the size of each variable length data block in the set is stored in a header section 802 (FIG. 8) of memory.

For example, as shown in FIG. 8, the header section 802 of the memory may comprise a header 804, 806, 808, 810 for each variable length data block in the set. Specifically, in FIG. 8 there is a first header 804 for the first variable length data block 702 in the set, a second header 806 for the second variable length data block 704 in the set, a third header 808 for the third variable length data block 706 in the set, and a fourth header 810 for the fourth variable length data block 708 in the set. In some cases, the header for a variable length data block may be relatively small (e.g. 1 byte). It will be evident to a person of skill in the art that this is an example only and that in other cases there may be a single header for each set of variable length data blocks. Each header 804, 806, 808, 810 comprises block size information 812 which identifies the size of the variable length data block. As described in more detail below, each header 804, 806, 808, 810 may also, in some cases, comprise other information 814.

The block size information 812 may comprise the size (e.g. in bytes) of the variable length data block. The size of a variable length data block can be used be determine: (i) how many B-sized portions are stored in the maximum accessible data unit section for that variable length data block; and (ii) the size of the remainder portion for that variable length data block.

If the order of the remainder portions in the remainder section is known or predetermined then the location of each of the remainder portions can also be determined from the sizes of the remainder portions. For example, in FIG. 8 the remainder portions 726, 728, 730, 732 are stored back to back in the remainder section 504 such that the remainder portion 726 for the first variable length data block 702 is stored first; the remainder portion 728 for the second variable length data block 704 is stored second; the remainder portion 730 for the third variable length data block 706 is stored third; and the remainder portion 732 for the fourth variable length data block 708 is stored fourth. If it is known from the block size information 812 of the headers 804, 806, 808, 810 that the remainder portion 726 for the first variable length data block 702 has a size of x (e.g. x bytes) and the remainder portion 728 for the second variable length data block 704 has a size of y (e.g. y bytes), then it can be determined that the remainder portion 728 for the second variable length data block 704 starts at offset x and is y bytes in size.

In other cases, instead of storing the actual size of a variable length data block in the header section, the block size information 812 may comprise (i) the number of B-sized portions stored in memory, and (ii) the size of the remainder portion.

Where the location of the remainder portions in memory cannot be determined from the size information alone (e.g. because the order of the remainder portions in the remainder section is not predetermined) then the method 600 may proceed to step 608 where information identifying the location of each remainder portion in memory is stored in the header section of memory. The information identifying the location of the remainder portions in the remainder section may be stored in the other information 814 of the headers 804, 806, 808, 810.

In some cases, the information identifying the location of the remainder portions in the remainder section may comprise information indicating or identifying the starting address of each remainder portion in the remainder section. For example, an address of the corresponding remainder portion in memory, or an offset (e.g. from the starting address of the remainder section) from which the address of the corresponding remainder portion in memory can be determined, may be stored in the header 804, 806, 808, 810 for each variable length data block.

In other cases, the information identifying the locations of the remainder portions in the remainder section may comprise information identifying the order of the remainder portions in the remainder section. For example, the header 804, 806, 808, 810 for each variable length data block may comprise an order field which indicates the order of the corresponding remainder portion in the remainder section. For example, where there are four variable length data blocks in the set, the header 804, 806, 808, 810 for each variable length data block may comprise an order field which indicates whether the corresponding remainder section is the first, second, third, or fourth remainder portion in the remainder section.

Once the information identifying the locations of the remainder portions in the remainder section has been stored in the header section 802 of memory, then the method 600 ends. The method 600 may then be executed for a different set of variable length data blocks.

Figure 9:
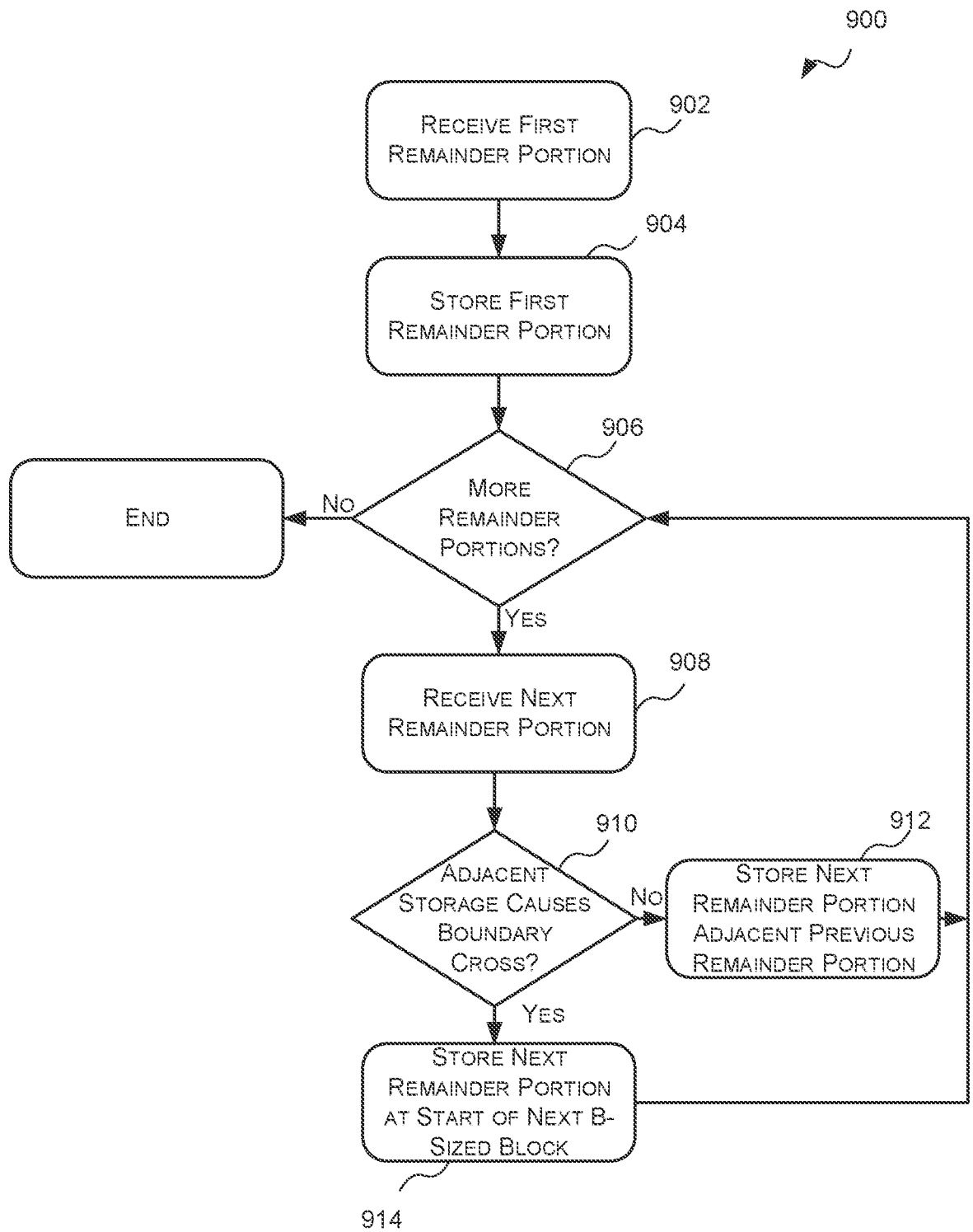
FIG. 9 is a flow diagram of an example method of storing remainder portions in the remainder section of the portion of memory of FIG. 5.

Reference is now made to FIG. 9 which illustrates an example method 900 of storing the remainder portions for a set of M variable length data blocks in the remainder section 504. In this example the remainder section 504 is divided into a plurality of B-sized (i.e. maximum accessible data sized) parts 1002, 1004, 1006, 1008 as shown in FIG. 10. In this method 900 the remainder portions are stored back to back (or adjacent each other) in the remainder section unless placing a remainder portion adjacent the previous remainder portion will cause that remainder portion to be stored in a plurality of B-sized parts of the remainder section. The method 900 may be used to implement step 604 of the method 600 of FIG. 6.

The method begins at step 902 where the logic 404 receives a first remainder portion (e.g. the remainder portion 726 for the first variable length data block ('Block 0') 702). Once the first remainder portion is received, the method 900 proceeds to step 904 where the logic 404 causes the first remainder portion to be stored at one end of the remainder section 504 (e.g. the start or end of the remainder section 504). For example, as shown in FIG. 10, the first remainder portion 726 may be stored at the start of the remainder section 504. Causing the first remainder portion to be stored at one end of the remainder section 504 may comprise: (i) storing the first remainder portion at one end of the remainder section 504; or (ii) generating a remainder block comprising the first remainder portion that, when stored in the remainder section, causes the first remainder portion to be stored at one end of the remainder section 504. The method 900 then proceeds to step 906.

At step 906, the logic 404 determines whether there are any other remainder portions for the set of M variable length data blocks. If there are no other remainder portions for the set of M variable length data blocks then the method 900 ends. If, however, there is at least one additional remainder portion for the set of M variable length data blocks, then the method 900 proceeds to step 908.

At step 908, the next remainder portion is received at the logic 404. The method 900 then proceeds to step 910 where the logic 404 determines whether storing the next remainder portion adjacent the previous remainder portion in the remainder section will cause that remainder portion to be stored in/across two different B-sized parts 1002, 1004, 1006 and 1008 of the remainder section. If it is determined that storing the next remainder portion adjacent the previous remainder portion in the remainder section will not cause that remainder portion to be stored in two different B-sized parts 1002, 1004, 1006 and 1008 of the remainder section then the method 900 proceeds to step 912 where the logic 404 causes that remainder portion to be stored adjacent the previous remainder portion in the remainder section. Causing the next remainder portion to be stored adjacent the previous remainder portion in remainder section 504 may comprise: (i) storing that remainder portion adjacent the previous remainder portion in the remainder section 504; or (ii) generating a remainder block comprising the previous remainder portion and the next remainder portion that, when stored in the remainder section, causes the next remainder portion to be stored adjacent the previous remainder portion in the remainder section 504.

If, however, it is determined that storing the next remainder portion adjacent the previous remainder portion in the remainder section will cause the next remainder portion to be stored in two different B-sized parts 1002, 1004, 1006 and 1008 of the remainder section then the method 900 proceeds to step 914 where the logic 404 causes the remainder portion to be stored at the start of the next B-sized (i.e. maximum accessible data sized) part of the remainder section. Causing the next remainder portion to be stored at the start of the next B-sized part of the remainder section may comprise: (i) storing that remainder portion at the start of the next B-sized part of the remainder section 504; or (ii) generating a remainder block comprising the previous remainder portion and the next remainder portion that, when stored in the remainder section, causes that remainder portion to be stored at the start of the next B-sized part of the remainder section 504.

After the location of the remainder portion in the remainder section 504 has been determined (in step 912 or 914) the method 900 proceeds back to step 906 where the logic 404 determines whether there are any more remainder portions for the set of M variable length data blocks. If there is another remainder portion, then steps 908 to 914 are repeated for that remainder portion. If there are no more remainder portions, then the method 900 ends.

For example, as shown in FIG. 10, if the second remainder portion 728 (i.e. the remainder portion of the second variable length data block ('Block 1') 704) is stored adjacent the first remainder portion 726, then the second remainder portion 728 will only be stored in a single B-sized part of the remainder section (i.e. part 1002). As a result, the second remainder portion 728 is stored in the remainder section 504 adjacent the first remainder portion 726. However, if the third remainder portion 730 (i.e. the remainder portion of the third variable length data block ('Block 2') 706) is stored adjacent the second remainder portion 728 then the third remainder portion 730 will be stored in/across two B-sized parts of the remainder section (i.e. parts 1002 and 1004) (this can be seen in FIG. 8). As a result, the third remainder portion 730 is not stored in the remainder section 504 adjacent the second remainder portion 728, instead the third remainder portion 730 is stored at the beginning of the next B-sized part (i.e. part 1004) of the remainder section 504. If the fourth remainder portion 732 (i.e. the remainder portion of the fourth variable length data block ('Block 3') 708) is stored adjacent the third remainder portion 730, then the fourth remainder portion 732 will only be stored in a single B-sized portion of the remainder section. As a result, the fourth remainder portion 732 is stored adjacent the third remainder portion 730 in the remainder section 504.

Figure 11:
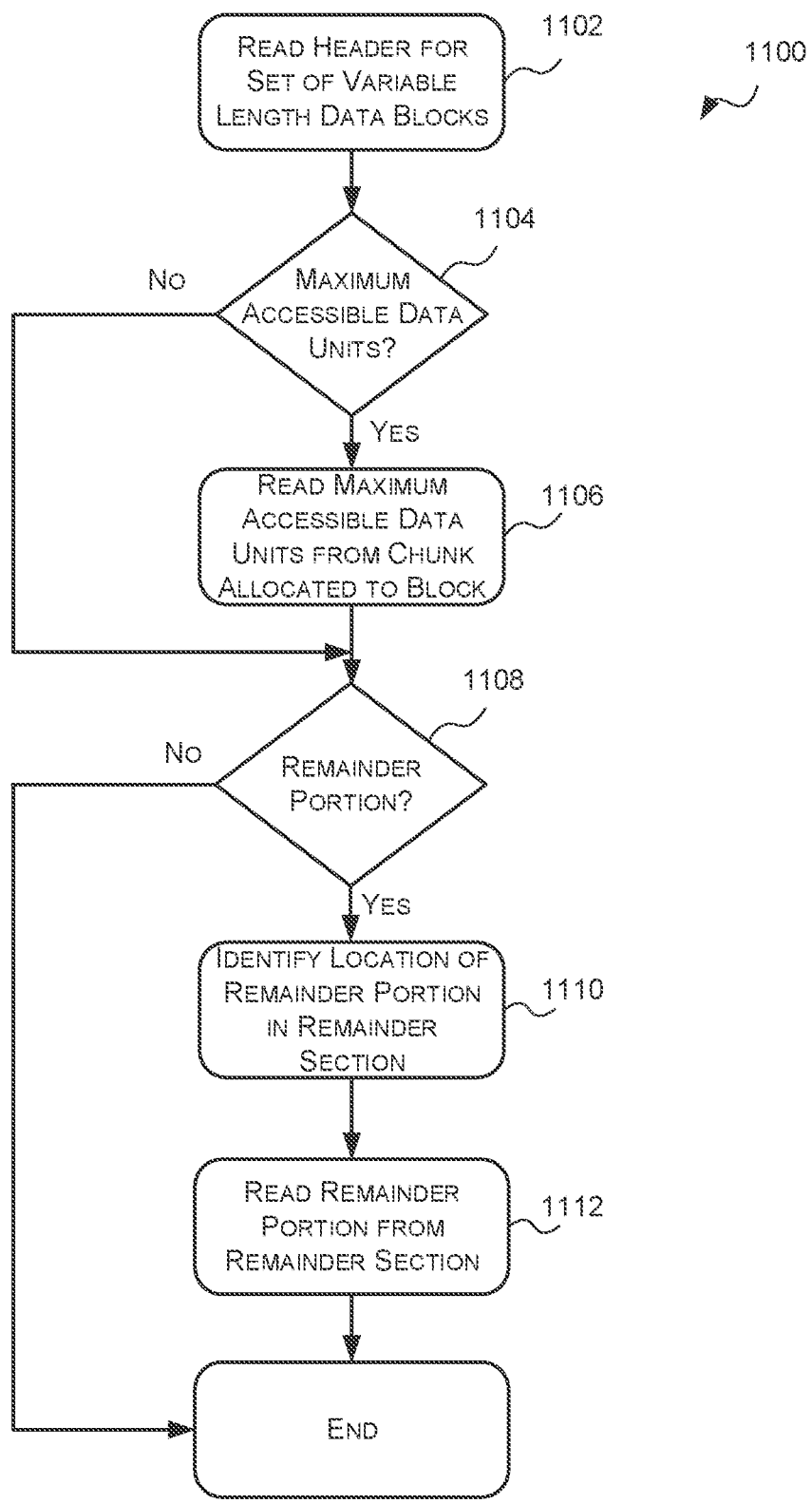
FIG. 11 is a flow diagram of an example method of reading a variable length data block from memory.

Reference is now made to FIG. 11 which illustrates an example method 1100 of reading a variable length data block from memory wherein the variable data length data block has been stored in the memory as part of a set of M variable length data blocks in accordance with the methods and systems described above. The variable length data block of the set which is to be read (or retrieved) from memory is referred to herein as the relevant variable length data block. The method 1100 may be executed by the logic 404 of FIG. 4 or other logic that is configured to retrieve a variable length data block from memory 402. The method 1100 begins at step 1102 where one or more headers associated with the set of M variable length data blocks is read from memory. The one or more headers comprises information indicating the size of each variable length data block in the set, and information indicating the location of the remainder section (if any) for each variable length data block in the set in the remainder section.

For example, as described above, there may be a header 804, 806, 808, 810 for each variable length data block in the set of four variable length data blocks 702, 704, 706, 708 of FIG. 7. Each header comprises information identifying the size of the corresponding variable length data block. The information identifying the size of the corresponding variable length data block may comprises a total size (e.g. in bytes), or may comprise the number of maximum accessible data units and the size of the remainder portion. Each header may, in some cases, additionally comprise information that identifies the location of the remainder portions in memory.

At step 1104, a determination is made, from the header(s) read in step 1102, whether the relevant variable length data block comprises at least one maximum accessible data unit (i.e. a unit of size B). The determination of whether the variable length data block comprises at least one maximum accessible data unit may be based on the size of the relevant variable length data block. For example, if the relevant variable length data bock has a size less than the size of the maximum accessible data unit then the variable length data block does not comprise at least one maximum accessible data unit. If, however, the relevant data block has a size greater than or equal to the size of the maximum accessible data unit then the variable length data block comprises at least one maximum accessible data unit.

If it is determined that the relevant variable length data block comprises at least one maximum accessible data unit, then the method 1100 proceeds to step 1106. If, however, it is determined that the relevant variable length data block does not comprise any maximum accessible data units, then the method 1100 proceeds to step 1108.

At step 1106, the first P maximum accessible data units of the relevant variable length data block are read from the chunk of the maximum accessible data unit section of the memory allocated to the relevant variable length data block.

As described above, each set of M variable length data blocks is allocated a portion 500 of memory which is divided into a maximum accessible data unit section 502 and a remainder section 504. Each variable length data block in the set is allocated an equal sized chunk of the maximum accessible data unit section. The chunk of the maximum accessible data unit section allocated to a variable length data block is of size X*B, wherein X is an integer less than N. Accordingly, each chunk can store up to X maximum accessible data units.

Reading the first P maximum accessible data units of the relevant variable length data block may comprise identifying the number of maximum accessible data units G the relevant variable length data block comprises. The number of maximum accessible data units G the relevant variable length data block comprises may be calculated as the floor of (S/B) where S the size of the relevant variable length data block and B is the maximum accessible data size. If G is less than or equal to X then G maximum accessible data units are read from the chunk of memory allocated to the relevant variable length data block. If, however, G is greater than X then X maximum accessible data units are read from the chunk of memory. In other words, P=min (floor(S/B), X) wherein "floor" represents the floor function that returns the closest integer that is less than or equal to the input value.

Each maximum accessible data unit can be accessed via a single memory access request. Accordingly, the number of memory access requests to read the first P maximum accessible data units for the relevant variable length data block from memory is equal to P. For example, it would take three memory access requests to read the three maximum accessible data units 710, 712, 714 of the first example variable length data block 702 from the chunk 506 of memory allocated to that variable length data block, and it would take two memory access requests to read the two maximum accessible data units 716, 718 of the second example variable length data block 704. Once the first P maximum accessible data units for the relevant variable length data block are read from the chunk allocated to that variable length data block, the method 1100 proceeds to step 1108.

At step 1108, a determination is made, from the one or more headers, whether the relevant variable length data block comprises a remainder portion that is not in the chunk of memory allocated to that variable length data block. The determination of whether the relevant variable length data block comprises a remainder portion may be based on the size of the variable length data block and the size of the chunk allocated to the variable length data block (e.g. X). If it is determined that there is a remainder portion for the relevant variable length data block, then the method 1100 proceeds to step 1110. If, however, it is determined that there is no remainder portion for the relevant variable length data block then the method 1100 ends.

At step 1110, the size and location of the remainder portion in the remainder section for the set of M variable length data blocks is determined from the one or more headers read in step 1102. The size of the remainder portion can be determined from the information identifying the size of the variable length data block. As described above, where the order of the remainder sections in the memory is predetermined the location of the remainder sections in memory may be determined from the sizes of the remainder portions for the variable length data blocks in the set. In other cases, the location of the remainder portions in the remainder section may be determined from additional information in the headers, such as, but not limited to an order of the remainder portions in the remainder section or the start address/offset of the remainder portions in the remainder section. Once the size and location of the remainder portion in the remainder section has been determined, the method 1100 proceeds to step 1112.

At step 1112, the remainder portion for the relevant variable length data block is read from the identified location in the remainder section. The number of memory access requests to read the remainder portion from memory depends on the size of the remainder portion and the method used to store the remainder portions in the remainder section. For example, even in cases where the maximum size of a remainder portion is a maximum accessible data size, it may take multiple access requests to retrieve the remainder portion from memory. For example, as shown in FIG. 8 if the remainder portions 726, 728, 730, 732 are stored back to back (or adjacent one another) in the remainder section, one or more of the remainder portions may be stored in/across multiple B-size parts of the remainder section. Specifically, as shown in FIG. 8, the third remainder portion 730 is stored in multiple B-sized parts of the remainder section, thus it would take two memory access requests to read the third remainder portion 730 from memory. Once the remainder portion for the relevant variable length data block has been read from memory the method ends.

Although not shown in FIG. 4, the memory system 400 may comprise a (e.g. on-chip) cache which stores, for example, the most recently read maximum accessible data units/parts of the remainder sections (e.g. B-sized units). Where multiple remainder portions are stored in the same maximum accessible data unit this may reduce the number of memory access requests required to read a variable length data block from memory. For example, as shown in FIG. 8, the remainder portion 726 of the first variable length data block 702 and the remainder portion 728 of the second variable length data block 704 are both stored in the first maximum accessible data unit/part of the remainder section 504. If that maximum accessible data unit/part is read to retrieve the first variable length data block it will be stored in the cache. If then the second variable length data block is subsequently read from memory the remainder portion for the second variable length data block can be obtained from the cache instead of via a memory access request.

Figure 12:
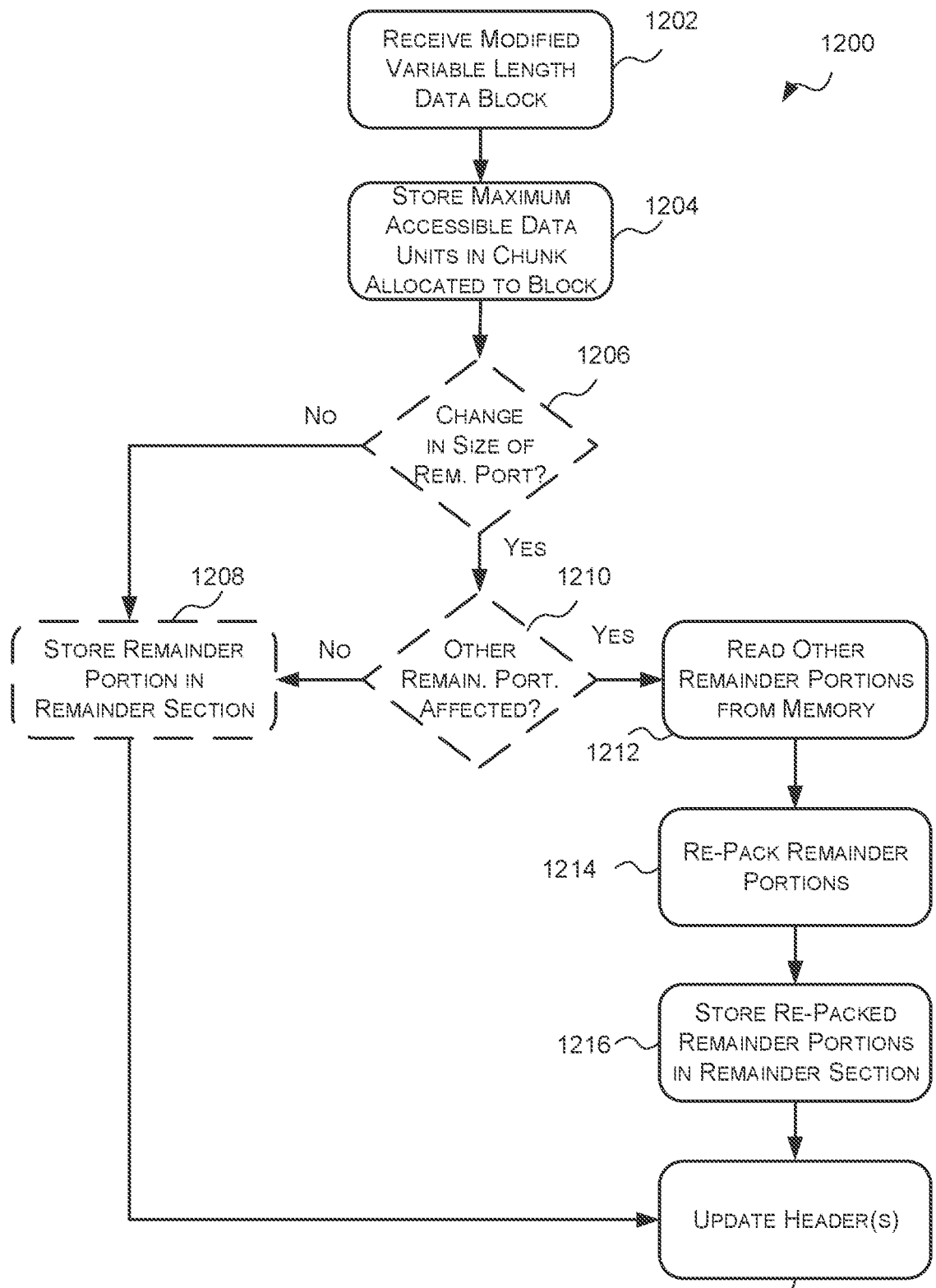
FIG. 12 is a flow diagram of an example method of storing a modified variable length data block in memory.

Reference is now made to FIG. 12 which illustrates an example method 1200 of writing a variable length data block (which forms part of a set of variable length data blocks which are stored in memory together) to memory after the variable length data block has been updated or modified. The variable length data block of the set which is being modified and written is referred to herein as the relevant variable length data block. The method 1200 may be executed after the relevant variable length data block has been read from memory (e.g. in accordance with the method 1100 of FIG. 11).

The method 1200 may be implemented by the logic 404 of FIG. 4 or other logic that is configured to write variable length data blocks to memory. The method 1200 begins at step 1202 where an updated or modified variable length data block of a set is received. For example, the set of variable length data blocks 702, 704, 706, 708 shown in FIG. 7 may be stored in memory in accordance with the method 600 of FIG. 6 as shown in FIG. 8. If the relevant variable length data block is the first variable length data block 702, the first variable length data block 702 may be subsequently read from memory (e.g. in accordance with the method 1100 of FIG. 11) and then modified to generate a modified variable length data block 1302 shown in FIG. 13. Once the modified variable length data block has been received, the method 1200 proceeds to step 1204.

At step 1204, the first P maximum accessible data units of the modified variable length data block are stored in the chunk of memory allocated to the relevant variable length data block (i.e. the chunk of the maximum accessible data unit section allocated to the relevant variable length data block), wherein X (X<N) is the number of maximum accessible data units that can be stored in the chunk of memory. As described above, this may comprise identifying the number of maximum accessible data units G that the modified variable length data block comprises (e.g. calculating $$G = \left\lfloor \frac{S}{B} \right\rfloor$$

wherein S is the size of the modified variable length data block and B is the maximum accessible data size). If it is determined that the modified variable length data block comprises X, or fewer, maximum accessible data units (i.e. G≤X), those maximum accessible data units are stored in the chunk of memory allocated to the relevant variable length data block. If, however, it is determined that the modified variable length data block comprises more than X maximum accessible data units (i.e. G>X) then the first X maximum accessible data units of the modified variable length data block are stored in the chunk of memory allocated to the relevant variable length data block.

Figure 13:
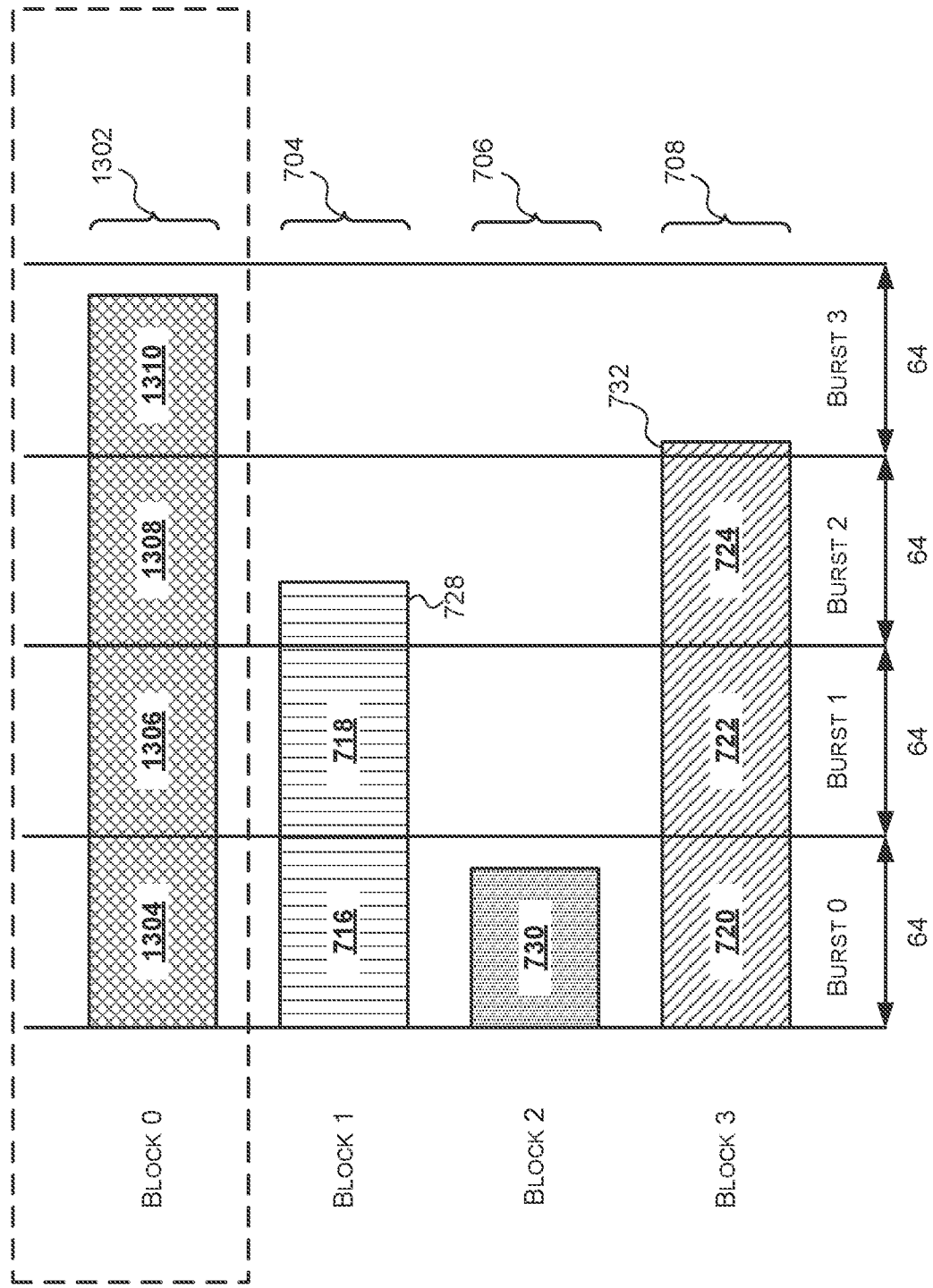
FIG. 13 is a schematic diagram illustrating a modified variable length data block.
Figure 14:
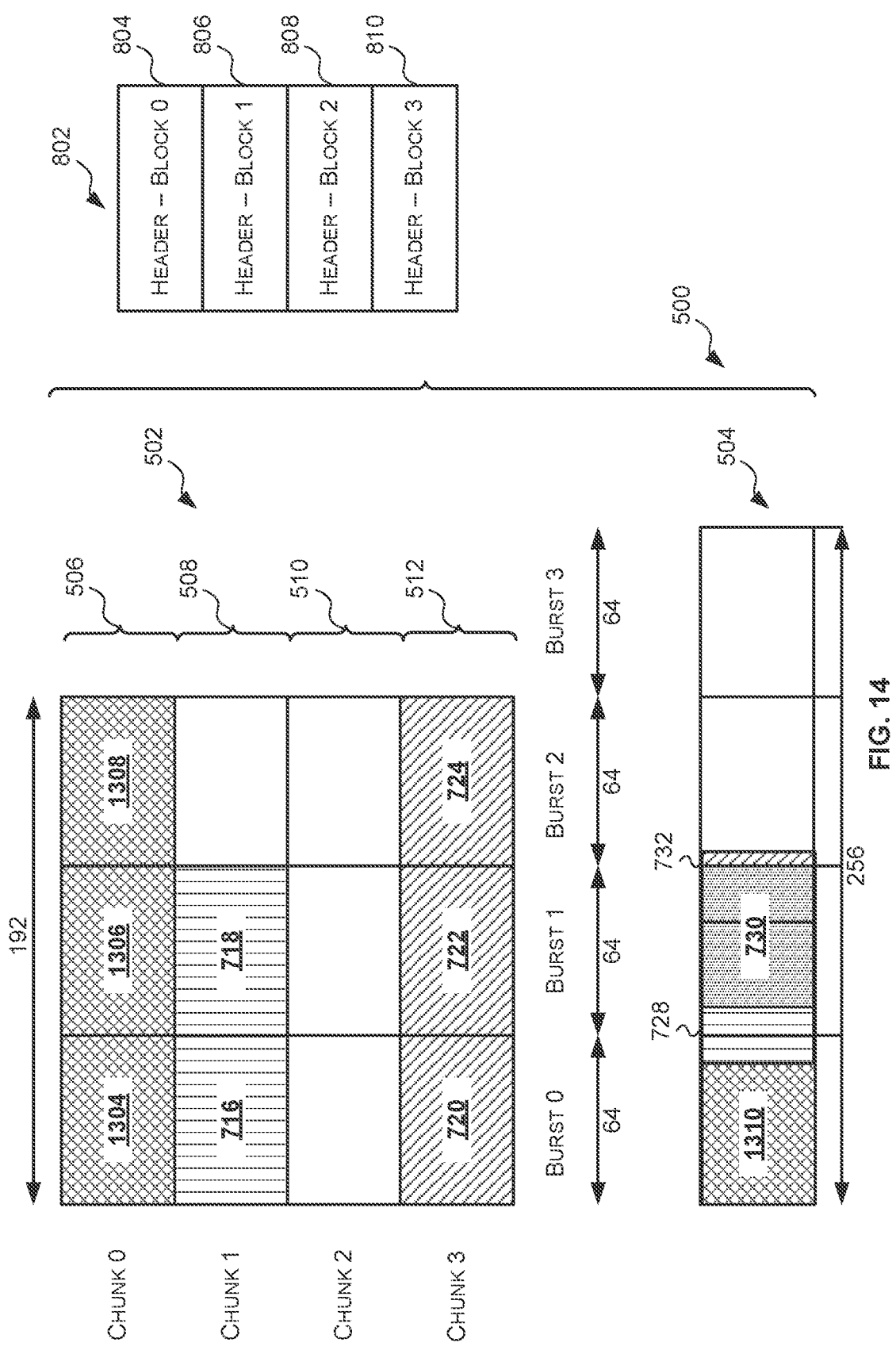
FIG. 14 is a schematic diagram illustrating storing the modified variable length data block of FIG. 13 in memory.

For example, the modified variable length data block 1302 of FIG. 13 comprises three maximum accessible data units 1304, 1306 and 1308. Since the example chunk 506 allocated to the relevant variable length data block can hold up to three maximum accessible data units, those three maximum accessible data units 1304, 1306, 1308 are written to the chunk 506 allocated to that variable length data block as shown in FIG. 14. Once the first P maximum accessible data units of the modified variable length data block have been stored in the chunk of memory allocated to the relevant variable length data block, the method 1200 proceeds to step 1206.

At step 1206, a determination is made as to whether the size of the remainder portion of the modified variable length data block is different than the size of the remainder portion of the variable length data block prior to the modification. Specifically, it is determined whether the modifications have made the remainder portion of the variable length data block smaller or larger. If it is determined that the size of the remainder portion of the modified variable length data is not different than the size of the remainder portion of the variable length data block prior to the modification, then the method 1200 proceeds to step 1208 where the remainder portion of the modified variable length data block (i.e. the portion of the modified variable length data block not falling within the first P maximum accessible data units), if any, is stored in the remainder section in the same location of the remainder section as the remainder portion of the original/previous variable length data block. If, however, it is determined that the size of the remainder portion of the modified variable length data block is different than the size of the remainder portion of the variable length data block prior to the modification, then the method 1200 proceeds to step 1210. In the example shown in FIG. 13 the remainder portion 1310 of the modified variable length data block 1302 is larger than the remainder portion 726 of the original variable length data block 702 shown in FIG. 7 so in this example the method 1200 proceeds to step 1210.

At step 1210, a determination is made as to whether the change in size of the remainder portion of the modified variable length data block affects any of the other remainder portions stored in the remainder section. The remainder portions that are affected by the change in size of the remainder portion of the modified variable length data block are those that have to be re-packed or re-stored in the remainder section to accommodate the change in size of the remainder portion of the modified variable length data block. The remainder portions that are affected by the change in size of the variable length data block may depend on the method used to store the remainder portions in the remainder section and/or the size of the remainder portion of the modified variable length data block.

For example, where the remainder portions are stored in the remainder section back to back (or adjacent each other) as shown in FIG. 8 then the remainder portions that are affected by a change in size of the variable length data block are those remainder portions stored in the remainder section after the remainder portion of the relevant variable length data block. Accordingly, in these cases, if the remainder portion for the modified variable length data block is the last remainder portion in the remainder section there are no remainder portions that are affected by the change in size of that variable length data block. If, however, the remainder portion for the modified variable length data block is not the last remainder portion in the remainder section, then there will be at least one remainder portion that is affected by the change in size of the modified variable length data block.

For example, if, as in the example of FIG. 13, the first variable length data block 702 is modified and the remainder portions are stored in order (e.g. the remainder portions for the first, second, third and fourth variable length data blocks are stored in the remainder portion in that order) then the remainder portions for the second, third and fourth variable length data blocks are stored in the remainder section after the remainder portion for the first variable length data block and thus are the remainder portions that are affected by the change in size of the remainder portion of the first variable length data block. Accordingly, in this example, the remainder portions 728, 730 and 732 for the second, third and fourth variable length data blocks are the remainder portions affected by the change in size of the remainder portion for the modified variable length data block.

Where, however, the remainder portions are stored in the remainder section back to back (or adjacent each other) unless that would cause a remainder portion to cross a B-sized boundary as shown in FIG. 10, then the remainder portions that are affected by a change in size of the variable length data block may be, based on the size the remainder portion, (i) the remainder portions in the remainder section after the remainder section of the relevant variable length data block; or (ii) none of the remainder portions. For example, with reference to FIG. 10, if the second variable length data block 704 is modified such that the remainder portion thereof is larger than the original remainder portion 728, so long as the remainder portion of the modified second variable length data block can fit in the first B-sized part 1002 then the remainder portions 730, 732 following it in the remainder section are not affected by the change in size of the remainder portion. If, however, the remainder portion of the modified second variable length data block can no longer completely fit in the first B-sized part 1002 then the remainder portions 730, 732 following it in the remainder section will be affected by the change in size of the remainder portion. Similarly, with reference to FIG. 10, if the second variable length data block 704 is modified such that the remainder portion thereof is smaller than the original remainder portion 728, so long as the remainder portion of the modified second variable length data block does not shrink so much that the remainder portion 730 for the third variable length data block can also be stored in the first B-sized portion then the remainder portions 730, 732 following it are not affected by the change in size of the remainder portion. If, however, the remainder portion of the modified second variable length data block has shrunk such that the remainder portion 730 for the third variable length data block can now be stored in the first B-sized part 1002 of the remainder section then the remainder portions 730, 732 for the third and fourth variable length data blocks will be affected by the change in size of the remainder portion of the modified variable length data block.

If it is determined that there are no other remainder portions affected by the change in size of the remainder portion of the modified variable length data block, then the method 1200 proceeds to step 1208 where the remainder portion of the modified variable length data block is written to the same location in memory as the previous remainder portion for the relevant variable length data block. If, however, it is determined that there is at least one other remainder portion that is affected by the change in size of the remainder portion of the modified variable length data block, then the method 1200 proceeds to step 1212.

At step 1212, the other remainder portions identified in step 1210 are read from the remainder section (i.e. those affected by the change in size of the remainder portion of the modified variable length data block). Once the other remainder portions are read from the remainder section, the method 1200 proceeds to step 1214.

At step 1214, the remainder portion of the modified variable length data block and the remainder portions that are read in step 1212 are re-packed in accordance with any of the methods described above for storing remainder portions in the remainder section. Once the re-packed remainder block has been generated the method 1200 proceeds to step 1216 where the re-packed remainder block is stored in the remainder section. For example, the remainder portion 1310 for the modified variable length data block 1302 of FIG. 13 may be re-packed back to back (e.g. adjacent each other) with the remainder portions 728, 730 and 732 of the second, third and fourth variable length data blocks to form a re-packed remainder block which is written to the remainder section 504 as shown in FIG. 14. Once the re-packed remainder block has been stored in memory the method 1200 proceeds to step 1218.

At step 1218, the header associated with one or more variable length data blocks are updated to reflect the current size of the variable length data block and/or the location of the remainder portions. At a minimum the header associated with the modified variable length data block 1302 is updated to reflect the size of that variable length data block. For example, in the example of FIGS. 13 and 14 the header for the first variable length data block is updated to reflect the current size of that variable length data block. Depending on what additional information is stored in the headers, the header for one or more of the other variable length data blocks in the set may also be updated. For example, as described above, in some cases, additional information may be stored in the header for each variable length data block which indicates the location of each of the remainder portions in the remainder section. If the additional information comprises information indicating an order of the corresponding remainder portion in the remainder section then if the order of the remainder portions has not changed then the header for the other variable length data blocks may not be updated. If, however, the additional information comprises the start address of the corresponding remainder section then the header of each of the variable length data blocks in which the remainder portion thereof has been moved may be updated to reflect the new start address of the remainder portion.

Although in the example method 1200 described with respect to FIG. 12 the reading of the other remainder portions from memory and the re-packing thereof is only performed if it is determined that modification of the variable length data block has changed the size of the remainder portion of the variable length data block, in other examples it may be more efficient to perform steps 1212 to 1218 for each modified variable length data block regardless of whether the modification has changed the size of the remainder portion.

As described above, storing a set of variable length data blocks in the manner described above (e.g. storing maximum accessible data units thereof in chunks allocated to each variable length data block in the set, and storing any remaining portions thereof (portions of the variable length data blocks not falling in a maximum accessible data unit) in a shared remainder section) allows a modified version of the block to be stored in the memory in a much more efficient manner compared to the method described with respect to FIG. 3 as only the relevant remainder portions need to be read, re-packed and re-stored instead of the entire variable length data blocks.

As described above, the described systems, logic and methods may be used in a graphics processing system to store blocks of data, such as, but not limited to, compressed frame buffer data, in memory of the graphics processing system, and/or read a block of data, such as, but not limited to, compressed frame buffer data, from memory of the graphics processing system. For example, the graphics processing system may generate pixel data that corresponds to block of pixels, and each block of pixel data may be compressed to form a variable length data block.

Graphics processing systems are configured to receive graphics data, e.g. from an application (e.g. a game application) running on a computer system, and to render an image from the graphics data to provide a rendering output. For example, an application may generate a 3D model of a scene and output geometry data representing the objects in the scene. In particular, the application may represent each object using one or more primitives (i.e. simple geometric shapes, such as, but not limited to rectangles, triangles, lines and points to which a texture can be applied) which are defined by the position of one or more vertices. In these cases, the geometry data output by the application may include information identifying each vertex (e.g. the coordinates of the vertex in world space) and information indicating the primitives formed by the vertices. The graphics processing system then converts the received geometry data into an image that may be displayed on a screen.

A graphics processing system may, for example, implement immediate mode rendering (IMR) or tile-based rendering (TBR). In IMR the entire scene is rendered as a whole. In contrast, in TBR a scene is rendered using a rendering space which is divided into subsections, which are referred to as tiles, wherein at least a portion of the rendering process may be performed independently for each tile. The tiles may have any suitable shape, but are typically rectangular (wherein the term "rectangular" includes square). An advantage of TBR is that fast, on-chip memory can be used during the rendering for colour, depth and stencil buffer operations, which allows a significant reduction in system memory bandwidth over IMR, without requiring on-chip memory that is large enough to store data for the entire scene at the same time.

TBR involves two key phases: a geometry processing phase; and a rasterization phase. During the geometry processing phase the geometry data (e.g. vertices defining primitives) received from an application (e.g. a game application) is transformed from world space coordinates into screen space coordinates. A per-tile list is then created of the transformed primitives (e.g. triangles) that, at least partially, fall within the bounds of the tile. During the rasterization phase each tile is rendered separately (i.e. the transformed primitives are mapped to pixels and the colour is identified for each pixel in the tile). This may comprise identifying which primitive(s) are visible at each pixel. The colour of each pixel may then be determined by the appearance of the visible primitive(s) at that pixel which may be defined by a texture applied at that pixel and/or the pixel shader program run on that pixel. A pixel shader program describes operations that are to be performed for given pixels. Rendering each tile separately enables the graphics processing system to only retrieve the transformed primitive data related to a particular tile when rendering that tile in the rasterization phase, which keeps bandwidth requirements for the memory (e.g. intermediate buffer) low. Once a colour value has been identified for each pixel in a tile the colour values for the tile are written out to memory (e.g. a frame buffer). Once the entire scene has been rendered (i.e. once colour values have been determined for the pixels of all of the tiles) the scene may be, for example, displayed on a screen.

Figure 15:
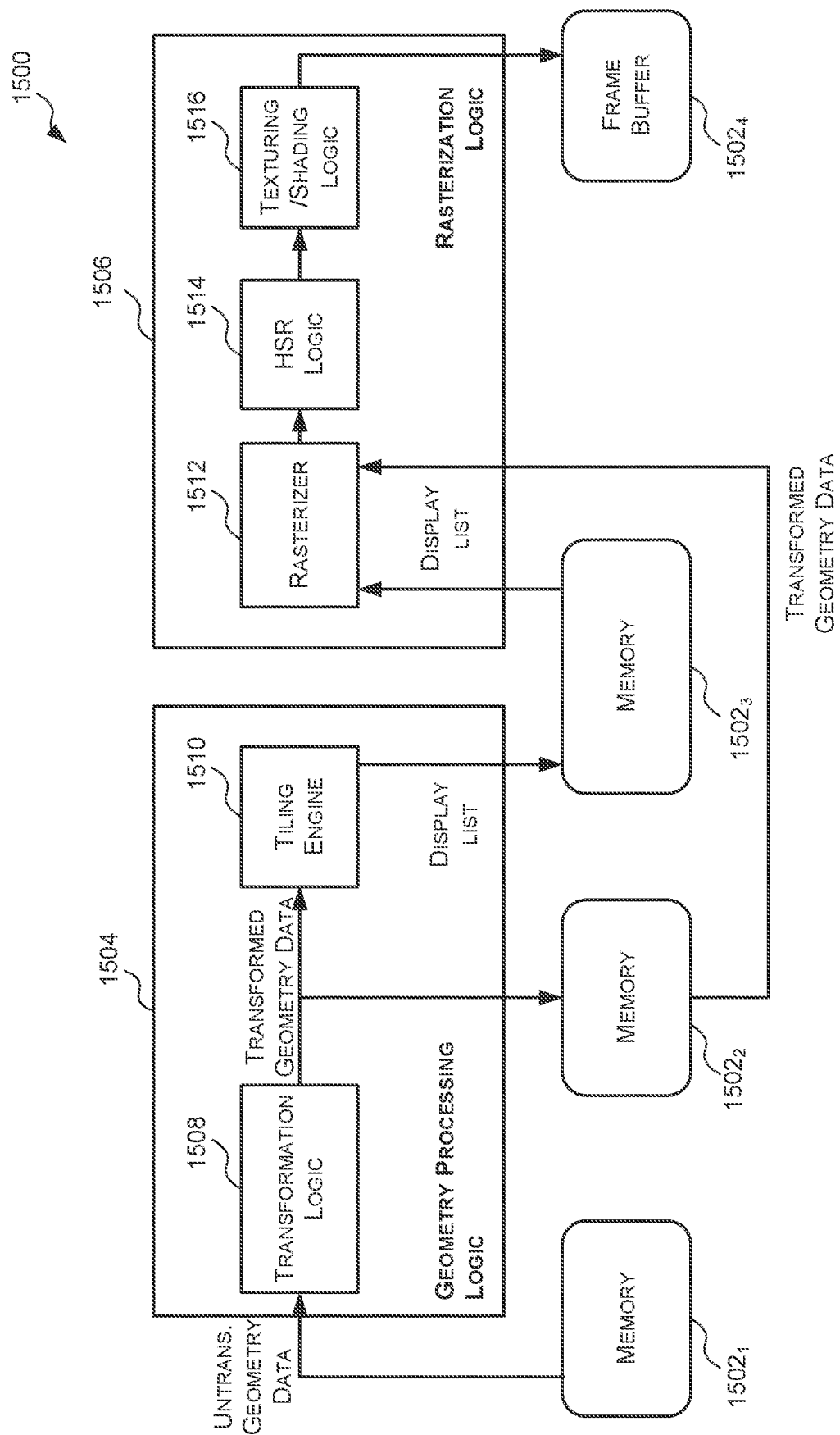
FIG. 15 is a block diagram of an example graphics processing system in which the methods and memory systems (or the logic thereof) described herein may be implemented.

FIG. 15 illustrates an example TBR graphics processing system 1500. The system 1500 comprises memory $1502_1$, $1502_2$, $1502_3$, $1502_4$, geometry processing logic 1504 and rasterization logic 1506. Two or more of the memories $1502_1$, $1502_2$, $1502_3$, and $1502_4$ may be implemented in the same physical unit of memory.

The geometry processing logic 1504 implements the geometry processing phase of TBR. The geometry processing logic 1504 comprises transformation logic 1508 and a tiling engine 1510. The transformation logic 1508 receives geometry data (e.g. vertices, primitives and/or patches) from an application (e.g. a game application) and transforms the geometry data into the rendering space (e.g. screen space). The transformation logic 1508 may also perform functions such as clipping and culling to remove geometry data (e.g. primitives or patches) that falls outside of a viewing frustum, and/or apply lighting/attribute processing as is known to those of skill in the art. The transformed geometry data (e.g. vertices, primitives and/or patches) is: (i) stored in the memory $1502_2$, and (ii) provided to the tiling engine 1510. The tiling engine 1510 generates, from the transformed geometry data, a list, for each tile, of the transformed primitives that fall, at least partially, within that tile. The list may be referred to as a display list or a transformed display list. In some cases, the transformed display lists comprise pointers or links to the transformed geometry data (e.g. vertex data) related to the primitives that, at least partially, fall within the tile.

The rasterization logic 1506 implements the rasterization phase of TBR. Specifically, the rasterization logic 1506 renders the primitives in a tile-by-tile manner by fetching the display list for a tile from memory $1502_3$ and then fetching the transformed geometry data from memory $1502_2$ for the primitives that fall within the tile as indicated by the display list for that tile; and rendering the primitives for that tile based on the transformed geometry data.

In some cases, the rasterization logic 1506 may comprise a rasterizer 1512, hidden surface removal (HSR) logic 1514 and texturing/shading logic 1516. In these cases, the rasterizer 1512 fetches each of the display lists from memory $1502_3$ and for each display list fetches the transformed geometry data from memory $1502_2$ for the primitives that fall within a tile as specified by the corresponding display list, and converts each primitive into a set of primitive fragments. The term "fragment" is used herein to mean a sample of a primitive at a sampling point, which is to be processed to render pixels of an image. In some examples, there may be a one-to-one mapping of pixels to fragments. However, in other examples there may be more fragments than pixels, and this oversampling can allow for higher quality rendering of pixel values, e.g. by facilitating anti-aliasing and other filters that may be applied to multiple fragments for rendering each of the pixel values.

The primitive fragments for a particular tile are then provided to the HSR logic 1514 which removes primitive fragments which are hidden (e.g. hidden by other primitive fragments) by performing depth testing on the primitive fragments. The remaining fragments (after hidden surface removal) are then passed to the texturing/shading logic 1516 which performs texturing and/or shading on the primitive fragments to determine pixel values of a rendered image. The rendered pixel values for a tile are then stored in memory $1502_4$ (e.g. frame buffer). In some cases, the texturing/shading logic 1516 may be configured to group the pixel values into blocks of pixels and compress each block of pixels to generate compressed pixel blocks (which may be variable in length). In these cases the texturing/shading logic 1516 may be configured to store the compressed pixel blocks in memory in accordance with the methods described above.

The rasterization logic 1506 processes each of the tiles and when the whole image has been rendered and stored in the memory $1502_4$ (e.g. frame buffer) the image can be output from the graphics processing system 1500 and used in any suitable manner, for example, displayed on a display, stored in memory, or transmitted to another device, etc. The TBR graphics processing system 1500 shown in FIG. 15 is a "deferred" rendering system in the sense that fragments are processed by the HSR logic 1514 before being processed by the texturing/shading logic 1516. In other examples, the graphics processing system might not be a deferred rendering system in which case texturing/shading would be applied to fragments before HSR is applied to those fragments.

Figure 16:
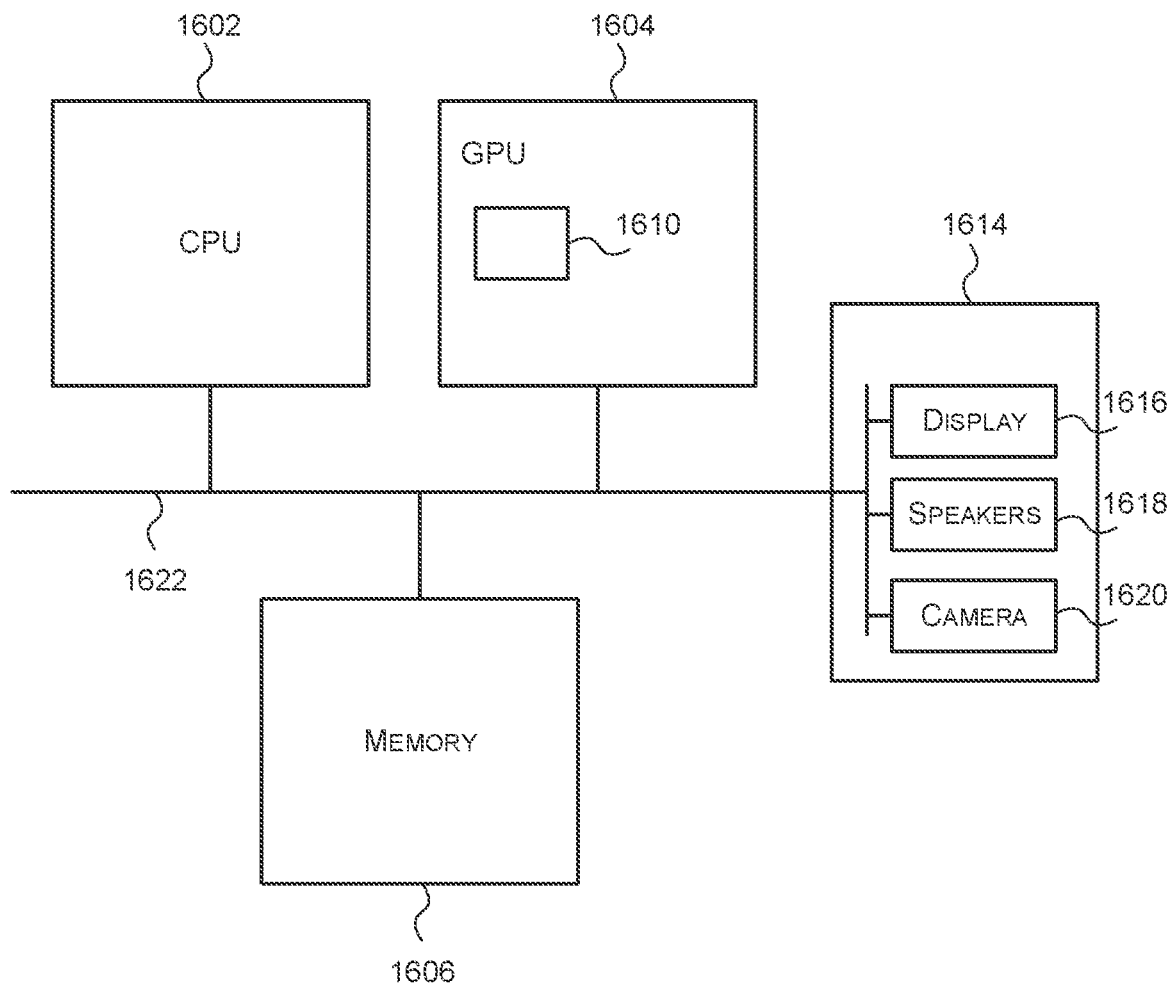
FIG. 16 is a block diagram of an example computer system in which the memory systems (or the logic thereof) and/or the graphics processing systems described herein may be implemented.

FIG. 16 shows a computer system in which the logic 404 described herein, or the graphics processing system 1500 described herein may be implemented. The computer system comprises a CPU 1602, a GPU 1604, a memory 1606 and other devices 1614, such as a display 1616, speakers 1618 and a camera 1620. A processing block 1610 (which may correspond to the logic 404 described herein or the graphics processing system 1500 described herein) is implemented on the GPU 1604. In other examples, the processing block 1610 may be implemented on the CPU 1602. The components of the computer system can communicate with each other via a communications bus 1622.

The memory system (or logic thereof) and graphics processing systems of FIGS. 4 and 15 are shown as comprising a number of functional blocks. This is schematic only and is not intended to define a strict division between different logic elements of such entities. Each functional block may be provided in any suitable manner. It is to be understood that intermediate values described herein as being formed by the memory system (or the logic thereof) or graphics processing system, need not be physically generated by the memory system (or the logic thereof) or the graphics processing system at any point and may merely represent logical values which conveniently describe the processing performed by the memory system (or the logic thereof) or graphics processing system between its input and output.

The memory systems (or the logic thereof) and graphics processing systems described herein may be embodied in hardware on an integrated circuit. The memory systems (or the logic thereof) and graphics processing systems described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a memory system (or the logic thereof) or a graphics processing system configured to perform any of the methods described herein, or to manufacture a memory system (or the logic thereof) or a graphics processing system comprising any apparatus described herein. An integrated circuit definition dataset may be, for example, an integrated circuit description.

Therefore, there may be provided a method of manufacturing, at an integrated circuit manufacturing system, a memory system (or the logic thereof) or a graphics processing system as described herein. Furthermore, there may be provided an integrated circuit definition dataset that, when processed in an integrated circuit manufacturing system, causes the method of manufacturing a memory system (or the logic thereof) or a graphics processing system to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a memory system (or the logic thereof) or a graphics processing system will now be described with respect to FIG. 17.

Figure 17:
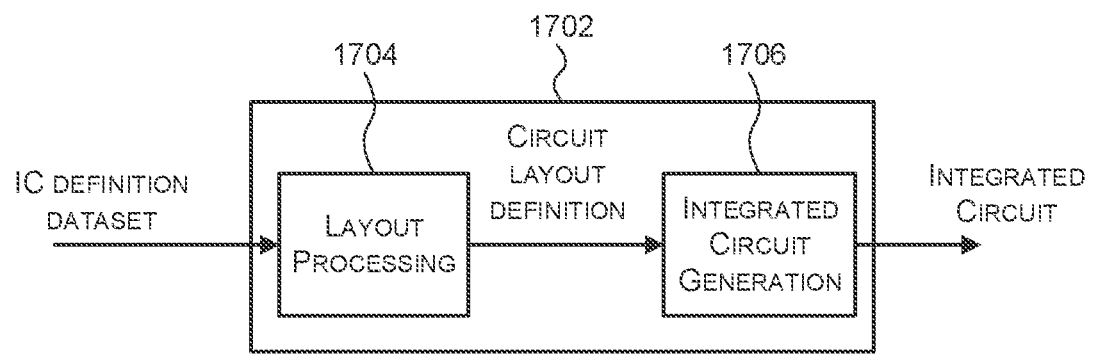
FIG. 17 is a block diagram of an example integrated circuit manufacturing system for generating an integrated circuit embodying the memory systems (or the logic thereof) and/or the graphics processing systems described herein.

FIG. 17 shows an example of an integrated circuit (IC) manufacturing system 1702 which is configured to manufacture a memory system (or the logic thereof), or a graphics processing system as described in any of the examples herein. In particular, the IC manufacturing system 1702 comprises a layout processing system 1704 and an integrated circuit generation system 1706. The IC manufacturing system 1702 is configured to receive an IC definition dataset (e.g. defining a memory system (or the logic thereof) or a graphics processing system as described in any of the examples herein), process the IC definition dataset, and generate an IC according to the IC definition dataset (e.g. which embodies a memory system (or the logic thereof) or a graphics processing system as described in any of the examples herein). The processing of the IC definition dataset configures the IC manufacturing system 1702 to manufacture an integrated circuit embodying a memory system (or the logic thereof) or a graphics processing system as described in any of the examples herein.

The layout processing system 1704 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1704 has determined the circuit layout it may output a circuit layout definition to the IC generation system 1706. A circuit layout definition may be, for example, a circuit layout description.

The IC generation system 1706 generates an IC according to the circuit layout definition, as is known in the art. For example, the IC generation system 1706 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1706 may be in the form of computer-readable code which the IC generation system 1706 can use to form a suitable mask for use in generating an IC.

The different processes performed by the IC manufacturing system 1702 may be implemented all in one location, e.g. by one party. Alternatively, the IC manufacturing system 1702 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a memory system (or the logic thereof) or a graphics processing system without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 17 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 17, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of storing a set of M variable length data blocks in a memory, each variable length data block having a maximum size of N*B, wherein M and N are integers greater than or equal to two and B is a maximum data size writable to the memory using a single memory access request, the method comprising:

allocating the set of M variable length data blocks a portion of the memory greater than or equal to M*N*B independent of a size of the variable length data blocks in the set, the portion of memory being partitioned into a maximum accessible data unit section and a remainder section;

storing, for each variable length data block in the set, first P non-overlapping portions of size B of the variable length data block in the maximum accessible data unit section, wherein P is a minimum of: (i) a number of non-overlapping portions of size B of the variable length data block, and (ii) X, wherein X is an integer less than N;

storing any remaining portions of the variable length data blocks in the set in the remainder section; and storing, in a header section of the memory, information indicating a size of each of the variable length data blocks in the set.

2. The method of claim 1, wherein storing the remaining portions of the variable length data blocks in the set in the remainder section comprises storing the remaining portions of the variable length data blocks in the set adjacent each other in the remainder section.

3. The method of claim 2, wherein the remaining portions of the variable length data blocks in the set are stored adjacent each other in the remainder section starting from a starting address of the remainder section.

4. The method of claim 2, wherein the remaining portions of the variable length data blocks in the set are stored adjacent each other in the remainder section starting from a last address of the remainder section.

5. The method of claim 1, wherein the remainder section is divided into a plurality of B-sized parts and storing the remaining portions of the variable length data blocks in the set in the remainder section comprises:

storing the remaining portion of a first variable length data block in the set at a start or at an end of the remainder section;

making a determination, for each other variable length data block in the set, whether storing the remaining portion of the variable length data block adjacent to a previous remaining portion in the remainder section will cause the remaining portion of the variable length data block to be stored in at least two B-sized parts of the plurality of the B-sized parts;

in response to determining that storing the remaining portion of a variable length data block adjacent the previous remaining portion in the remainder section will cause the remaining portion to be stored in at least two B-sized parts of the plurality of the B-sized parts, storing the remaining portion at a start of a next B-sized part of the remainder section; and in response to determining that storing the remaining portion of a variable length data block adjacent to the previous remaining portion in the remainder section will not cause the remaining portion to be stored in at least two B-sized parts of the plurality of the B-sized parts, storing the remaining porting adjacent the previous remaining portion in the remainder section.

6. The method of claim 1, wherein storing the remaining portions of the variable length data blocks in the set in the remainder section comprises forming one or more remainder blocks from the remaining portions and storing the one or more remainder blocks in the remainder section.

7. The method of claim 1, wherein the first P non-overlapping portions of size B of the variable length data blocks in the set are stored in the maximum accessible data unit section in an order and the remaining portions of the variable length data blocks in the set are stored in the remainder section in that order.

8. The method of claim 1, wherein the first P non-overlapping portions of size B of the variable length data blocks in the set are stored in the maximum accessible data unit section in an order and the remaining portions of the variable length data blocks in the set are stored in the remainder section in a different order.

9. The method of claim 1, wherein X is equal to N−1.

10. The method of claim 9, wherein the remainder section has a size of M*B.

11. The method of claim 1, wherein storing, in the header section of the memory, information indicating the size of each of the variable length data blocks in the set comprises storing in a header for each of the variable length data blocks in the set information identifying the size of the variable length data block.

12. The method of claim 1, further comprising:
receiving a modified version of a variable length data block in the set;
storing first P non-overlapping portions of size B of the modified version of the variable length data block in the maximum accessible data unit section;
reading the remaining portion of at least one other variable length data block in the set from the remainder section;
forming a remainder block from any remaining portion of the modified version of the variable length data block and the remaining portion of the at least one other variable length data block; and
storing the remainder block in the remainder section.

13. The method of claim 1, wherein at least one of the variable length data blocks in the set comprises a compressed block of data that was compressed in accordance with a lossless compression algorithm.

14. The method of claim 1, wherein:
the maximum accessible data unit section is sub-divided into M equal-sized chunks, and each variable length data block in the set is allocated one of the M equal-sized chunks; and
the first P non-overlapping portions of a variable length data block in the set are stored in the chunk of the maximum accessible data unit section allocated to the variable length data block.

15. The method of claim 14, wherein each of the M equal-sized chunks has a size of X*B.

16. A memory system for storing a set of M variable length data blocks in a memory, each variable length data block having a maximum size of N*B, wherein M and N are integers greater than or equal to two and B is a maximum data size writable to the memory using a single memory access request, the memory system comprising:
said memory, wherein said memory comprises:
a portion allocated to the set of M variable length data blocks, the portion being greater than or equal to M*N*B independent of a size of the variable length data blocks in the set, the portion being partitioned into a maximum accessible data unit section and a remainder section, and
a header section; and
logic configured to:
store, for each variable length data block in the set, first P non-overlapping portions of size B of the variable length data block in the maximum accessible data unit section, wherein P is a minimum of: (i) a number of non-overlapping portions of size B of the variable length data block, and (ii) X, wherein X is an integer less than N,
store, in the remainder section, any remaining portions of the variable length data blocks in the set, and
store, in the header section, information indicating a size of each variable length data block in the set.

17. A graphics processing system configured to perform the method as set forth in claim 1.

18. A graphics processing system comprising the memory system as set forth in claim 16.

19. A non-transitory computer readable storage medium having stored thereon computer readable instructions that, when executed at a computer system, cause the computer system to perform the method as set forth in claim 1.

20. A non-transitory computer readable storage medium having stored thereon a computer readable dataset description of the memory system as set forth in claim 16 that, when processed in an integrated circuit manufacturing system, causes the integrated circuit manufacturing system to manufacture an integrated circuit embodying the memory system.

* * * * *